(12) United States Patent
Abhinav et al.

(10) Patent No.: US 12,306,616 B2
(45) Date of Patent: May 20, 2025

(54) SYSTEM AND METHOD FOR GENERATING AN ASSEMBLY SEQUENCE FOR A PRODUCT

(71) Applicant: Accenture Global Solutions Limited, Dublin (IE)

(72) Inventors: Kumar Abhinav, Hazaribag District (IN); Alpana Dubey, Bangalore (IN); Suma Mani Kuriakose, Mumbai (IN); Bharat Ladrecha, Bikaner (IN)

(73) Assignee: Accenture Global Solutions Limited, Dublin (IE)

( * ) Notice: Subject to any disclaimer, the term of this patent is extended or adjusted under 35 U.S.C. 154(b) by 348 days.

(21) Appl. No.: 17/556,878

(22) Filed: Dec. 20, 2021

(65) Prior Publication Data

US 2023/0195088 A1 Jun. 22, 2023

(51) Int. Cl.
*G05B 19/418* (2006.01)

(52) U.S. Cl.
CPC .......... *G05B 19/41865* (2013.01); *G05B 2219/31053* (2013.01); *G05B 2219/33025* (2013.01)

(58) Field of Classification Search
CPC .... G05B 19/41865; G05B 2219/31053; G05B 2219/33025; G05B 2219/35134; G06Q 10/0633; G06Q 50/04
See application file for complete search history.

(56) References Cited

U.S. PATENT DOCUMENTS

| | | | |
|---|---|---|---|
| 2017/0066092 A1 | 3/2017 | Yamamoto | |
| 2021/0192358 A1* | 6/2021 | Song | G06N 3/088 |
| 2022/0226994 A1* | 7/2022 | Gombolay | B25J 9/1682 |
| 2023/0076988 A1* | 3/2023 | Durand | G06F 30/12 |

FOREIGN PATENT DOCUMENTS

| | | | | |
|---|---|---|---|---|
| CN | 112699915 A | | 4/2021 | |
| KR | 20140094345 A | * | 7/2014 | G06F 17/10 |
| WO | WO-2022251741 A1 | * | 12/2022 | G06F 30/27 |

OTHER PUBLICATIONS

European Patent Office, Communication, Extended European Search Report issued for European Patent Application No. 22212106.3, dated May 22, 2023, 10 pages.
(Continued)

*Primary Examiner* — Chun Cao

(57) ABSTRACT

Aspects of the present disclosure provide systems, methods, and computer-readable storage media that support mechanisms for generating a feasible assembly plan for a product based on data analytics. In aspects, information on components of a product is obtained from one or more product models (e.g., a three-dimensional (3D) computer aided design (CAD) model) that define the individual components of the product. The individual component information may be used to represent the assembly of the product as an assembly graph, in which each node of the assembly graph represents one of the components of the product to be assembled. The assembly graph is passed through a set of data analytics modules to generate the feasible assembly plan, or assembly sequence, as a series of sequential contact predictions, wherein each contact prediction identifies a component to be connected to one or more other components of the product.

20 Claims, 15 Drawing Sheets

(56) References Cited

OTHER PUBLICATIONS

Worner, J. M. et al. "Feature Recognition for Graph-Based Assembly Product Representation Using Machine Learning," IEEE 21st International Conference on Control, Automation and Systems, Oct. 2021, 7 pages.

Harish, A. N. et al. "RGL-NET: A Recurrent Graph Learning Framework for Progressive Part Assembly," IEEE/CVF Winter Conference on Applications of Computer Vision, Feb. 2022, 10 pages.

Upadhyay, A. et al. 3D-DSPNET: Product Disassembly Sequence Planning, IEEE International Conference on Multimedia and Expo Workshops, Jul. 2022, 6 pages.

Lee, M.-L. et al. "A Real-Time Receding Horizon Sequence Planner for Disassembly in a Human-Robot Collaboration Setting," Proceedings of the International Symposium on Flexible Automation, American Society of Mechanical Engineers, Jul. 2020, 9 pages.

Costa, C. M. et al. "Automatic Generation of Disassembly Sequences and Exploded Views from SolidWorks Symbolic Geometric Relationships," 18th IEEE International Conference on Autonomous Robot Systems and Competitions, 2018, 8 pages.

Smith, S. et al. "A Novel Selective Parallel Disassembly Planning Method for Green Design," Journal of Engineering Design, 2015, vol. 26, No. 10-12, 19 pages.

Kheder, M. et al. "Optimization of Disassembly Sequence Planning for Preventive Maintenance," The International Journal of Advanced Manufacturing Technology, 2017, vol. 90, No. 5, pp. 1337-1349, 13 pages.

Liu, J. et al. "Collaborative Optimization of Robotic Disassembly Sequence Planning and Robotic Disassembly Line Balancing Problem Using Improved Discrete Bees Algorithm in Remanufacturing," Robotics and Computer Integrated Manufacturing, vol. 61, 2020, 18 pages.

Guo, X. et al. "Disassembly Sequence Planning: A Survey," IEEE/CAA Journal of Automatica Sinica, vol. 8, No. 7, Jul. 2021, 17 pages.

Briceno, J. J. et al. "Automatic Disassembly Plan Generation from CAD Assembly Models," Proceedings of the 2007 IEEE International Symposium on Assembly and Manufacturing, IEEE, Jul. 2007, 6 pages.

Dekhtiar, J. et al. "Deep Learning for Big Data Applications in CAD and PLM—Research Review, Opportunities and Case Study," Computers in Industry, 2018, vol. 100, pp. 227-243, 17 pages.

Velickovic, P. et al. "Graph Attention Networks," Conference Paper, International Conference on Learning Representations, 2018, 12 pages.

Dzmitry, B. et al. "Neural Machine Translation by Jointly Learning to Align and Translate," Conference Paper, International Conference on Learning Representations, 2015, 15 pages.

\* cited by examiner

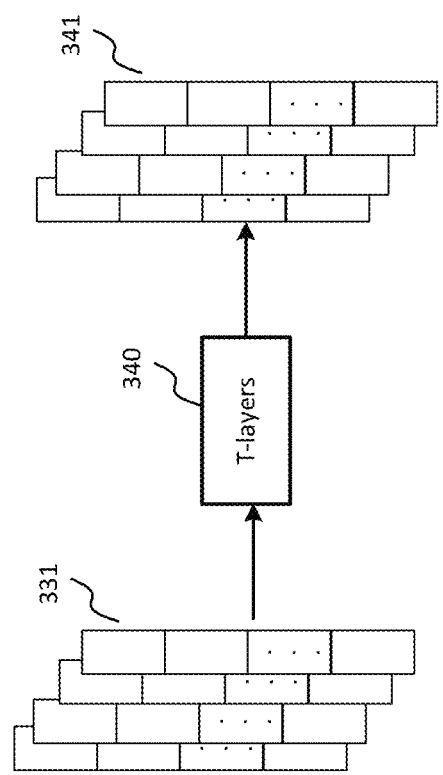

SYSTEM AND METHOD FOR GENERATING AN ASSEMBLY SEQUENCE FOR A PRODUCT

TECHNICAL FIELD

The present disclosure relates generally to product assembly analytics, and more particularly to a system for efficiently assessing and optimizing product assembly planning based on artificial intelligence analysis.

BACKGROUND

Planning assembly of a product is a very challenging task. Developing a plan, or sequence, for assembly of a product is an undertaking that may require at the very least complete details of individual parts of a product at assembly in order to determine a sequence for assembly. The details may include, e.g., geometry, alignment, and/or movement constraints of the parts or product during assembly, among other things. In some cases, especially when the product is complex with many individual components, finding an assembly sequence may be especially difficult, let alone finding the optimal sequence. In fact, finding an optimal plan for assembly may be very costly due to the exponential search space (e.g., the search space from within the optimal plan is to be searched) from which the assembly plan is to be searched. In some cases, assembly specific data may not be available to develop the assembly plan, which may be yet another obstacle to developing an assembly plan.

Currently, assembly planning may be performed manually, through trial and error (e.g., brute force) which may be time-consuming and very challenging, as different iterations of the assembly plan or sequence may be tried until a feasible plan may be found. Although there are some algorithms that are used for planning an assembly sequence, these algorithms are very specific and actually used to validate assembly sequences rather than to generate assembly sequences from product information. In these algorithmic approaches, manually-specified cost functions and/or rules are defined, and the algorithm is used to verify whether given assembly sequences meet the specified rules or not. When a particular assembly sequence is determined to meet the specified rules or cost functions, the assembly sequence is deemed valid. On the other hand, when a particular assembly sequence is determined not to meet the specified rules or cost functions, the assembly sequence is deemed invalid.

SUMMARY

Aspects of the present disclosure provide systems, methods, apparatus, and computer-readable storage media that support mechanisms for generating a feasible assembly plan for a product based on data analytics. In aspects, information on components of a product is obtained from one or more product models (e.g., a three-dimensional (3D) computer aided design (CAD) model) that define the individual components of the product. The individual component information may be used to represent the assembly of the product as an assembly graph, in which each node of the assembly graph represents one of the components of the product to be assembled. The assembly graph is passed through a set of data analytics modules to generate the feasible assembly plan, or assembly sequence, as a series of sequential contact predictions, wherein each contact prediction identifies a component to be connected to one or more other components of the product. In aspects, the set of data analytics modules may include an assembly descriptor module, a graph encoder module, and contact generation model.

In a particular aspect, a method for generating an assembly sequence for a product includes generating an assembly graph associated with assembly of the product based on information associated with each component of a plurality of components of the product. In aspects, each node of the assembly graph includes a node embedding for a component graph representing a respective component of the plurality of components, and an initial state of the assembly graph includes no links between any of two nodes of the initial assembly graph. In aspects, the method also includes applying the assembly graph to a recurrent graph neural network to generate the assembly sequence. In aspects, each recurrent step represents a step of the assembly sequence. In aspects, generating the assembly sequence includes, at each recurrent step, updating, by a graph encoder of the recurrent graph neural network, the node embedding for each node of the assembly graph based on a current state of the assembly graph, identifying, by a contact generation module of the recurrent graph neural network, based on the updated node embedding for each node of the assembly graph, a link between a node of the assembly graph and one or more other nodes of the assembly graph, adding the identified link between the node and the one or more other nodes to the assembly graph to update the current state of the assembly graph to include the identified link, and feeding back the assembly graph with the update current state including the identified link to the graph encoder to perform the updating, at a next recurrent step, using the updated current state of the assembly graph. In aspects, the identified link between the node of the assembly graph and the one or more other nodes represents an assembly connection between a component of the product represented by the node and one or more other components of the product represented by the one or more other nodes. The method further includes continuing the updating, identifying, adding, and feeding back until at least one link with another node is identified for every node of the assembly graph.

In another particular aspect, a system for generating an assembly sequence for a product includes a memory and one or more processors communicatively coupled to the memory. The one or more processors are configured to generate an assembly graph associated with assembly of the product based on information associated with each component of a plurality of components of the product. In aspects, each node of the assembly graph includes a node embedding for a component graph representing a respective component of the plurality of components, and an initial state of the assembly graph includes no links between any of two nodes of the initial assembly graph. The one or more processors are further configured to apply the assembly graph to a recurrent graph neural network to generate the assembly sequence. In aspects, each recurrent step represents a step of the assembly sequence. In aspects, the configuration of the one or more processors to generate the assembly sequence includes configuration of the one or more processors to, at each recurrent step, update, by a graph encoder of the recurrent graph neural network, the node embedding for each node of the assembly graph based on a current state of the assembly graph, identify, by a contact generation module of the recurrent graph neural network, based on the updated node embedding for each node of the assembly graph, a link between a node of the assembly graph and one or more other nodes of the assembly graph, add the identified link between the node and the one or more other nodes to the assembly graph to update the current state of the assembly graph to include the identified link, and feedback the assembly graph with the update current state including the identified link to the graph encoder to perform the update, at a next recurrent step, using the updated current state of the assembly graph. In aspects, the identified link between the node of the assembly graph and the one or more other nodes represents an assembly connection between a component of the product represented by the node and one or more other components of the product represented by the one or more other nodes. The one or more processors are further configured to continue updating, identifying, adding, and feeding back until at least one link with another node is identified for every node of the assembly graph.

In another particular aspect, a non-transitory computer-readable storage medium stores instructions that, when executed by one or more processors, cause the one or more processors to perform operations for generating an assembly sequence for a product. The operations include generating an assembly graph associated with assembly of the product based on information associated with each component of a plurality of components of the product. In aspects, each node of the assembly graph includes a node embedding for a component graph representing a respective component of the plurality of components, and an initial state of the assembly graph includes no links between any of two nodes of the initial assembly graph. In aspects, the operations also include applying the assembly graph to a recurrent graph neural network to generate the assembly sequence. In aspects, each recurrent step represents a step of the assembly sequence. In aspects, generating the assembly sequence includes, at each recurrent step, updating, by a graph encoder of the recurrent graph neural network, the node embedding for each node of the assembly graph based on a current state of the assembly graph, identifying, by a contact generation module of the recurrent graph neural network, based on the updated node embedding for each node of the assembly graph, a link between a node of the assembly graph and one or more other nodes of the assembly graph, adding the identified link between the node and the one or more other nodes to the assembly graph to update the current state of the assembly graph to include the identified link, and feeding back the assembly graph with the update current state including the identified link to the graph encoder to perform the updating, at a next recurrent step, using the updated current state of the assembly graph. In aspects, the identified link between the node of the assembly graph and the one or more other nodes represents an assembly connection between a component of the product represented by the node and one or more other components of the product represented by the one or more other nodes. The operations further include continuing the updating, identifying, adding, and feeding back until at least one link with another node is identified for every node of the assembly graph.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific aspects disclosed may be readily utilized as a basis for modifying or designing other structures for carrying out the same purposes of the present disclosure. It should also be realized by those skilled in the art that such equivalent constructions do not depart from the scope of the disclosure as set forth in the appended claims. The novel features which are disclosed herein, both as to organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following descriptions taken in conjunction with the accompanying drawings, in which:

FIG. 3B is a block diagram illustrating next S-layers of a GCN of graph encoder implemented in accordance with aspects of the present disclosure;

Figure 1:
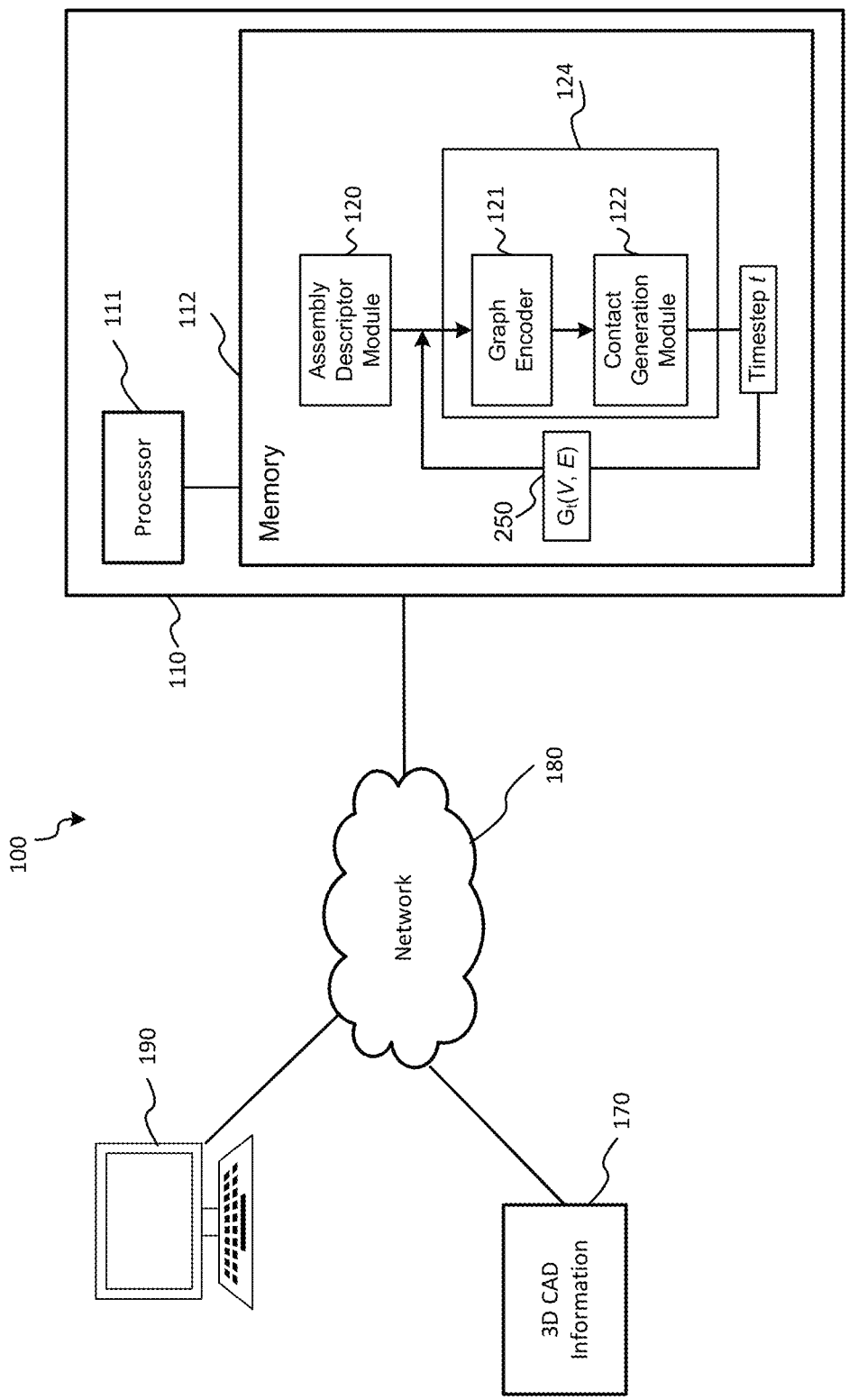
FIG. 1 is a block diagram of an example of a system that supports mechanisms for generating a feasible assembly plan for a product based on data analytics according to one or more aspects.

It should be understood that the drawings are not necessarily to scale and that the disclosed aspects are sometimes illustrated diagrammatically and in partial views. In certain instances, details which are not necessary for an understanding of the disclosed methods and apparatuses or which render other details difficult to perceive may have been omitted. It should be understood, of course, that this disclosure is not limited to the particular aspects illustrated herein.

DETAILED DESCRIPTION

Various features and advantageous details are explained more fully with reference to the non-limiting embodiments that are illustrated in the accompanying drawings and detailed in the following description. Descriptions of well-known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

Aspects of the present disclosure provide systems, methods, apparatus, and computer-readable storage media that support mechanisms for generating a feasible assembly plan for a product based on data analytics. In aspects, information on components of a product is obtained from one or more product models (e.g., a three-dimensional (3D) computer aided design (CAD) model) that define the individual components of the product. The individual component information may be used to represent the assembly of the product as an assembly graph, in which each node of the assembly graph represents one of the components of the product to be assembled. The assembly graph is passed through a set of data analytics modules to generate the feasible assembly plan, or assembly sequence, as a series of sequential contact predictions, wherein each contact prediction identifies a component to be connected to one or more other components of the product. In aspects, the set of data analytics modules may include an assembly descriptor module, a graph encoder module, and contact generation model.

In particular, the assembly descriptor module may generate the assembly graph representing the assembly of the product, in which each node of the assembly graph represents one of the components of the product to be assembled. The graph encoder module may be configured to encode the current state of the assembly graph into updated node embeddings of the assembly graph. In this manner, at each timestep, the graph encoder may generate node embeddings for the assembly graph representing the current state of the assembly. The contact generation module may be configured to receive the updated node embeddings of the current state of the assembly graph and identify which component is to be connected next, and to which other component or components the identified component is to be connected. In this manner, the contact generation module may be configured to identify at least one component to be connected to one or more other components based on the updated node embeddings of the current state of the assembly graph. In particular, the contact generation module may use the updated node embeddings received from the graph encoder to identify at least one edge (e.g., link) to be added to the graph. The link may be a connection or contact between one component node of the assembly graph and one or more other component nodes of the assembly graph. In this manner, at each timestep, the contact generation module may identify a component to be connected to the current assembly state. A new current assembly graph state may be generated by the contact generation module including the newly connected component node (e.g., including the newly added link or links). The new current assembly graph state is fed back into the graph encoder in order to obtain updated node embeddings for the assembly graph, and the updated node embeddings are fed into the contact generation module to identify a next component to be connected to the current assembly. In this manner, the set of data analytics modules operate in a recurrent manner, in which each recurrent step represents a step of the assembly sequence in which a component is connected to one or more other components. Moreover, the set of data analytics modules operate to predict a next component to be connected to the assembly based on the previous states of the graph assembly, which allows a system implemented in accordance with aspects of the present disclosure to identify a feasible assembly sequence for the product. This recurrent process continues until every component of the product is connected to at least one other component of the product.

As used herein, a feasible assembly plan, also referred to as a feasible assembly sequence, may refer to a series of sequence steps that may be used to assemble the product in a feasible manner. In aspects, the feasibility of the assembly sequence may be determined by business, technical, physical, legal, and/or any other type of requirements or considerations for assembling the product. For example, a feasible assembly sequence may be one that enables the product to be assembled, when the assembly sequence is followed, within a particular duration, or within a particular cost, or with a particular number of workers, etc.

Referring to FIG. 1, an example of a system that supports mechanisms for generating a feasible assembly plan for a product based on data analytics according to one or more aspects is shown as a system 100. As shown in FIG. 1, system 100 includes server 110, 3D CAD information 170, and at least one user terminal 190. These components, and their individual components, may cooperatively operate to provide functionality in accordance with the discussion herein. For example, in operation according to aspects, 3D CAD information 170, which may include modeling information for a product, such as 3D CAD models for each component of the product, may be provided to server 110. The various components of server 110 may cooperatively operate to use the individual component information to represent the assembly of the product as an assembly graph. The assembly graph may be processed to predict a next component connection based on updated embeddings of the assembly graph. The predicted steps at each timestep may be determined to be steps of the assembly plan.

What follows is a more detailed discussion of the functional blocks of system 100 shown in FIG. 1. However, it is noted that the functional blocks, and components thereof, of system 100 of embodiments of the present invention may be implemented using processors, electronic devices, hardware devices, electronic components, logical circuits, memories, software codes, firmware codes, etc., or any combination thereof. For example, one or more functional blocks, or some portion thereof, may be implemented as discrete gate or transistor logic, discrete hardware components, or combinations thereof configured to provide logic for performing the functions described herein. Additionally or alternatively, when implemented in software, one or more of the functional blocks, or some portion thereof, may comprise code segments operable upon a processor to provide logic for performing the functions described herein.

It is also noted that various components of system 100 are illustrated as single and separate components. However, it will be appreciated that each of the various illustrated components may be implemented as a single component (e.g., a single application, server module, etc.), may be functional components of a single component, or the functionality of these various components may be distributed over multiple devices/components. In such aspects, the functionality of each respective component may be aggregated from the functionality of multiple modules residing in a single, or in multiple devices.

It is further noted that functionalities described with reference to each of the different functional blocks of system 100 described herein is provided for purposes of illustration, rather than by way of limitation and that functionalities described as being provided by different functional blocks may be combined into a single component or may be provided via computing resources disposed in a cloud-based environment accessible over a network.

User terminal 190 may be implemented as a mobile device, a smartphone, a tablet computing device, a personal computing device, a laptop computing device, a desktop computing device, a computer system of a vehicle, a personal digital assistant (PDA), a smart watch, another type of wired and/or wireless computing device, or any part thereof. User terminal 101 may be configured to provide a GUI structured to facilitate input and output operations in accordance with aspects of the present disclosure. Input and output operations may include operations for requesting generation of an assembly sequence for a product, for providing modeling information for components of the products, for specifying requirements, rules, constraints, limitations, etc., to be applied in the generation of the assembly sequence, displaying the assembly sequence (e.g., the steps of the assembly sequence), etc.

Server 110, user terminal 190, and 3D CAD information 170 may be communicatively coupled via network 180. Network 180 may include a wired network, a wireless communication network, a cellular network, a cable transmission system, a Local Area Network (LAN), a Wireless LAN (WLAN), a Metropolitan Area Network (MAN), a Wide Area Network (WAN), the Internet, the Public Switched Telephone Network (PSTN), etc., that may be configured to facilitate communications between server 110, user terminal 190, and 3D CAD information 170.

Server 110 may be configured to receive 3D CAD information 170 (e.g., modeling information on the components of the product to be assembled by the assembly sequence, etc.), and to generate a feasible assembly sequence for assembling the product. This functionality of server 110 may be provided by the cooperative operation of various components of server 110, as will be described in more detail below. Although FIG. 1 shows a single server 110, it will be appreciated that server 110 and its individual functional blocks may be implemented as a single device or may be distributed over multiple devices having their own processing resources, whose aggregate functionality may be configured to perform operations in accordance with the present disclosure.

It is also noted that the various components of server 110 are illustrated as single and separate components in FIG. 1. However, it will be appreciated that each of the various components of server 110 may be a single component (e.g., a single application, server module, etc.), may be functional components of a same component, or the functionality may be distributed over multiple devices/components. In such aspects, the functionality of each respective component may be aggregated from the functionality of multiple modules residing in a single, or in multiple devices.

As shown in FIG. 1, server 110 includes processor 111 and memory 112. Processor 111 may comprise a processor, a microprocessor, a controller, a microcontroller, a plurality of microprocessors, an application-specific integrated circuit (ASIC), an application-specific standard product (ASSP), or any combination thereof, and may be configured to execute instructions to perform operations in accordance with the disclosure herein. In some aspects, as noted above, implementations of processor 111 may comprise code segments (e.g., software, firmware, and/or hardware logic) executable in hardware, such as a processor, to perform the tasks and functions described herein. In yet other aspects, processor 111 may be implemented as a combination of hardware and software. Processor 111 may be communicatively coupled to memory 112.

As shown in FIG. 1, memory 112 includes assembly descriptor module 120, graph encoder 121, and contact generation module 122. In aspects, the combination of the functionality of graph encoder 121 and contact generation module 122 may also be referred to as herein as a recurrent graph neural network 124. In aspects, the recurrent graph neural network may include implementing a graph neural network (GNN). In this implementation, at each timestep t, recurrent graph neural network 124 may encode a current state of assembly graph 250 (represented by G), which may be defined in terms of the nodes (represented by V) of the graph as well as the edges (represented by E) of the graph, to generate updated node embeddings for graph 250, and may then predict or generate a link (e.g., an edge) to be made between a node and one or more other nodes of the assembly graph based on the updated node embeddings. The generated link or edge may be taken as a generated step of the assembly sequence. In this manner, the recurrent approach of system 100 generates an assembly sequence by the operation of recurrent graph neural network 124, where a step of the assembly sequence is predicted, identified, and/or generated at each timestep t of the recurrence.

Memory 112 may comprise one or more semiconductor memory devices, read only memory (ROM) devices, random access memory (RAM) devices, one or more hard disk drives (HDDs), flash memory devices, solid state drives (SSDs), erasable ROM (EROM), compact disk ROM (CD-ROM), optical disks, other devices configured to store data in a persistent or non-persistent state, network memory, cloud memory, local memory, or a combination of different memory devices. Memory 112 may comprise a processor readable medium configured to store one or more instruction sets (e.g., software, firmware, etc.) which, when executed by a processor (e.g., one or more processors of processor 111), perform tasks and functions as described herein.

Assembly descriptor module 120 may be configured to generate and configure assembly graph 250 to represent the assembly of the product. In aspects, assembly graph 250 may be generated from 3D CAD information 170. As noted above, 3D CAD information 170 may include 3D modeling information for the product to be assembled. In particular, the 3D modeling information may include information on the components of the product to be assembled. Assembly descriptor module 120 may be configured to use 3D CAD information 170 and to generate and configure assembly graph 250. The functionality of assembly descriptor module 120 will be discussed in more detail with additional reference to FIGS. 2A and 2B.

Figure 2B:
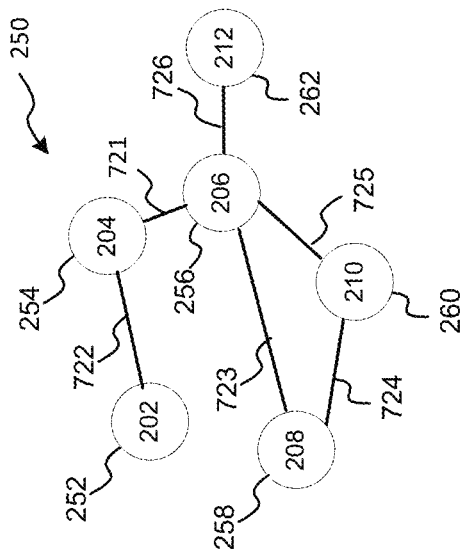
FIG. 2B is an example of an assembly graph associated with the product for which an assembly sequence is to be generated in accordance with aspects of the present disclosure.
Figure 2A:
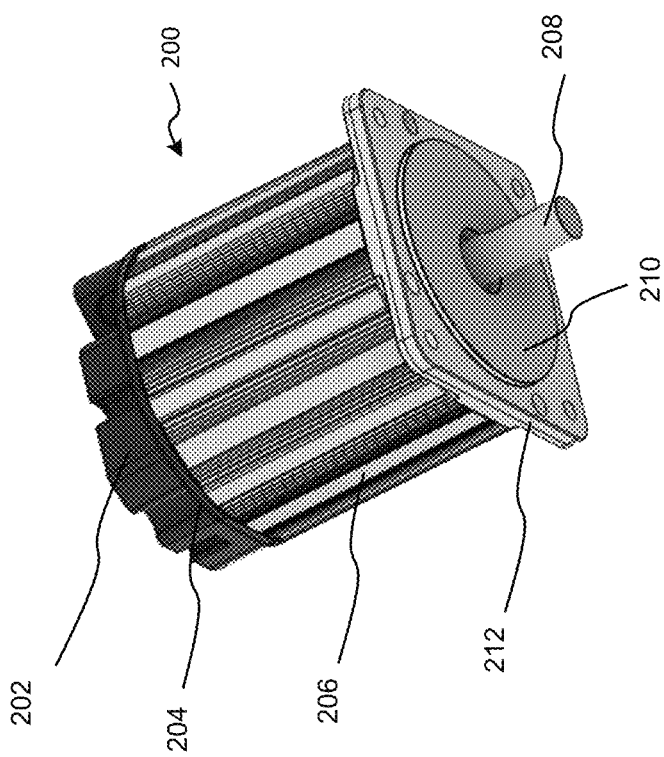
FIG. 2A is a view of a product for which an assembly sequence is to be generated in accordance with aspects of the present disclosure.

FIG. 2A is a view of a product 200 for which an assembly sequence is to be generated. FIG. 2B is an example of an assembly graph 250 associated with the product for which an assembly sequence is to be generated. As shown in FIG.

2A, product 200 may be a motor for which system 100 may operate to generate an assembly sequence. Product 200 may include several components, including cover 202, endplate 204, fillet 206, shaft 208, bearing 210, and front plate 212. In aspects, 3D CAD information 170 may include individual component information for each of the components of product 200. In aspects, assembly descriptor module 120 may generate assembly graph 250 based on the information associated with each of the components of product 200.

It is noted that the illustration of a motor as the product for which a sequence is to be generated is merely for illustrative purposes and not intended to be limiting in any way. It will be appreciated that the techniques described herein for generating an assembly sequence may be equally applicable to any product for which an assembly sequence is desired. Indeed, the example of the motor of FIG. 2A has been chosen as it is relatively simple and with relatively few components. In some cases, some products may be far more complex, and include hundreds or thousands of components. In this case, the benefits of the techniques disclosed herein are self-evident in that finding a feasible assembly sequence for such a complex product may be impracticable to be performed manually or by brute force.

As shown in FIG. 2B, each of the nodes of assembly graph 250 may represent or may be associated with a component of product 200. For example, node 252 may represent cover 202, node 254 may represent endplate 204, node 256 may represent fillet 206, node 258 may represent shaft 208, node 260 may represent bearing 210, and node 262 may represent front plate 212.

In aspects, the edges of assembly graph 250 may represent contact (also referred to herein as connection and/or link) or no contact between components. For example, assembly descriptor module 120 may generate assembly graph 250 to include information on edges between each two nodes of assembly graph 250. In particular, edge $e_{uv}$ for assembly graph 250 may represent the edge between two nodes u and v, and may be categorized into one of two types: no_edge, in which case there is no link between the two nodes and thus no contact relation between the components represented by node u and v, or hard_edge, in which case there is a link and thus a direct contact between the components represented by node u and v. For example, link 722 between node 252 and node 254 may represent contact between cover 202 and endplate 204. Similarly, link 721 between node 254 and node 256 may represent contact between endplate 204 and fillet 206, link 723 between node 256 and node 258 may represent contact between fillet 206 and shaft 208, link 724 between node 258 and node 260 may represent contact between shaft 208 and bearing 210, link 725 between node 260 and node 256 may represent contact between bearing 210 and fillet 206, and link 726 between node 256 and node 262 may represent contact between fillet 206 and front plate 212. However, there is no link between nodes 252 and 258, which means there is no contact between endplate 204 and shaft 208. It is noted that, as shown in assembly graph 250, some component nodes may be linked to only one other component node, and some component nodes may be linked to more than one other component node. This may represent that some components of product 200 may only contact one other component, but some components may contact more than one other component.

As will be appreciated, assembly graph 250, when including all the hard edges, or links, may provide a representation of the assembly of product 200. However, assembly graph 250 alone does not provide a feasible sequence for adding those edges. As will be described in the following, system 100 may provide techniques for identifying a feasible sequence for adding the edges of assembly graph 250. In this case, the sequence in which the links may be added by system 100 may represent the sequence of steps for assembling product 200, as a link may represent an assembly step for a component. In addition, as will be noted below, the sequence is cumulative in that the links may be added for each component sequentially, and at each timestep, the assembly becomes more and more complete, until it is complete (e.g., when all links of assembly graph 250 have been added).

Figure 2D:
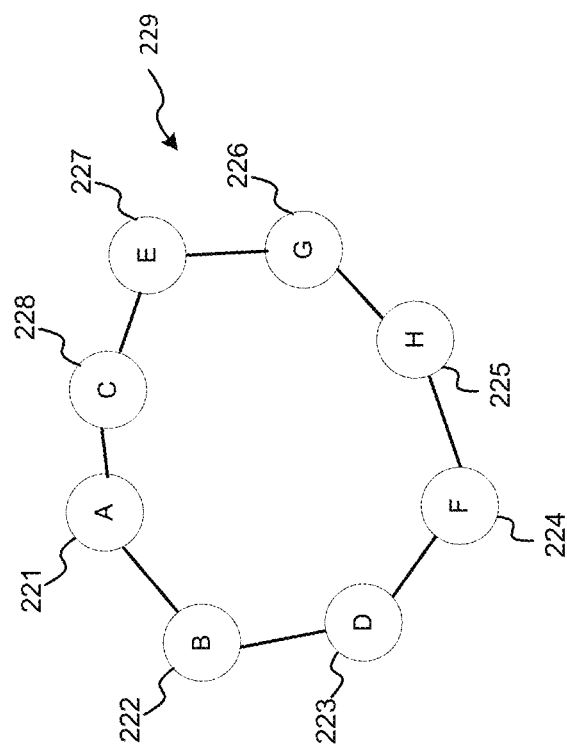
FIG. 2D is an example of a component graph for a component of a product configured in accordance with aspects of the present disclosure.
Figure 2C:
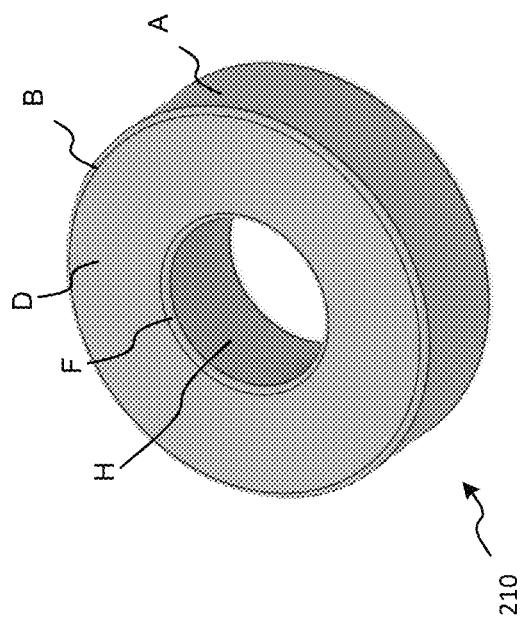
FIG. 2C is an example illustrating faces of a component of a product for which an assembly sequence is to be generated in accordance with aspects of the present disclosure.

In aspects, the initial form of assembly graph 250 may not include any discrete features. However, assembly descriptor module 120 may be configured to generate assembly graph 250 such that every component node of assembly graph 250 is represented by a component graph. The component graph of each component node is configured such that each node of the component graph represents a face of the respective component, and each edge of the graph represents a connection between the faces of the component. FIG. 2C is an example illustrating faces of bearing 210 of product 200. FIG. 2D is an example of a component graph for bearing 210 configured in accordance with aspects of the present disclosure. As seen in FIG. 2C, bearing 210 of product 200 may include multiple faces. Shown in FIG. 2C are faces A, B, D, F and H, while faces on the back of bearing 210 (e.g., faces C, E, and G) may not be shown as these faces may be obscured by the view of bearing 210. In this case, assembly descriptor module 120 may be configured to obtain component graph 229 for bearing 210. As shown in FIG. 2D, component graph 229 is configured with each of the faces of bearing 210 as nodes, and the connections between the different faces as edges. For example, face A is in contact with face B, and component graph 229 represents face A as node 221 linked to node 222 representing face B. Node 221 is also linked to node 228 representing face C, which indicates that face C is also in contact with face A. Similarly, faces D-H are representing by a corresponding node as illustrated, and the various links between the various nodes 221-228 may represent contact between the various faces of bearing 210. In this manner, component graph 229 represents bearing 210. As noted above, initially, assembly descriptor module 120 may create a component graph for each component of product 200 and may represent each node of assembly graph 250 by the component graph corresponding to the respective component. For example, for node 260 representing bearing 210, assembly descriptor module 120 may include component graph 229 as node 260. The same procedure may be performed for the other nodes of assembly graph 250.

In additional or alternative aspects, assembly descriptor module 120 may be configured to generate features for the component graphs of each of the components of product 200. For example, assembly descriptor module 120 may obtain a set of features for each face of a component graph by randomly sampling points in each of the faces of the respective component. In aspects, the set of features may include the points sampled from the face, as well as normal and trimming mask of these sampled points. In particular, for each face of a component of product 200, one or more points may be randomly sampled. The sampled points coordinate may be added as features to the component graph of the component. A normal may be obtain for each particular face of the component, which may allow a trimming mask to be generated. The trimming mask for a sampled point may indicate whether the sampled point is completely within the associated face or not, and may be a binary mask in which a 1 may indicate that the sampled point is completely contained within the associated face, and a 0 may indicate that the sample point is not completely contained within the associated face. The normal and the trimming mask may be included as features in the component graph of the component.

In aspects, assembly descriptor module 120 may be configured to output a final assembly graph 250 in which each component node is represented by a component graph and includes a set of features. In particular, each component graph may be represented by an adjacency matrix. However, the final assembly graph 250 output by assembly descriptor module 120 may be a disconnected assembly graph, in which no two component nodes are linked. In aspects, the disconnected assembly graph 250 output by assembly descriptor module 120 may be configured as an input to recurrent graph neural network 124, or in particular to graph encoder 121.

In aspects, as noted above, recurrent graph neural network 124 may be configured to receive the disconnected assembly graph 250 and to recurrently add links between nodes of assembly graph 250. The added links at each timestep t of the recurrent process may represent connections between one component and one or more other components of product 200. In this manner, at each timestep t, recurrent graph neural network 124 may generate a step of the assembly sequence for product 200. The assembly step generated at each timestep t may be generated as a link between one node and one or more other nodes of assembly graph 250. For example, at a timestep t of an assembly sequence, recurrent graph neural network 124 may identify and generate a link between a first node and two other nodes of assembly graph 250. In this case, the link may represent a contact connection between the component represented by the first node, and the two components represented by the two other nodes. In this manner, the assembly of product 200 is enabled by the addition of the contact connection of the component represented by the first node to the current assembly state.

For ease of explanation, the description of the functionality of recurrent graph neural network 124 may be divided between graph encoder 121 and contact generation module 122. In aspects, graph encoder 121 may be a recurrent graph encoder that may take as input, at each timestep t of the recurrent process, assembly graph 250, may obtain the current state of assembly graph 250 (e.g., may identify the current state of the assembly of product 200 at time step t, such as any connected edges), and may generate updated node embeddings for assembly graph 250. The updated node embeddings may be generated sequentially by graph encoder 121. The updated node embeddings may be fed into contact generation module 122 to identify and/or generate new links, thereby updating the status of assembly graph 250. The output of contact generation module 122 may be fed back to graph encoder 121 to repeat the process for the next timestep t+1 until there are no new links to be added to assembly graph 250 (e.g., there are no nodes left without a link to at least one other node in assembly graph 250).

In some aspects, graph encoder 121 may include a graph convolution network (GCN) with multiple graph convolution layers. In these aspects, the GCN may be used to obtain updated node features (e.g., node embeddings) of the input graph to the GCN. As such, in aspects, assembly graph 250 may be input into the GCN, which may output updated node embeddings (e.g., an updated set of features for each component of the assembly graph) for assembly graph 250. The updated set of features for assembly graph 250 may be useful in determining which nodes should be connected in the current timestep t. In aspects, the GCN of graph encoder 121 may be implemented in two parts, the first part including S-layers and the second part including T-layers.

In aspects, the functionality of the GCN of graph encoder 121 to updated the set of features of the component nodes of assembly graph 250 may be implemented in accordance with various aspects. In some aspects, the GCN of graph encoder 121 may include a graph convolution layer. For example, in a two-layer GCN, where C is the number of input channels and F is the number of feature maps in the output layer, and input graph represented by G(X, A), where X is the feature embedding of nodes in graph and A is the adjacency matrix, may be input into the two-layer GCN to map the input graph node features to the output F. In this manner, the features of the input graph may be updated and output as updated node embeddings.

In aspects, updating the set of node features (e.g., the node embeddings) of assembly graph 250 may include implementing a message passing network to exchange neighborhood information between the nodes. In this case, the node embeddings of a component node of assembly graph 250 may be updated based on the information received from the neighborhood, which may include adjacent component nodes to the component node.

Figure 2F:
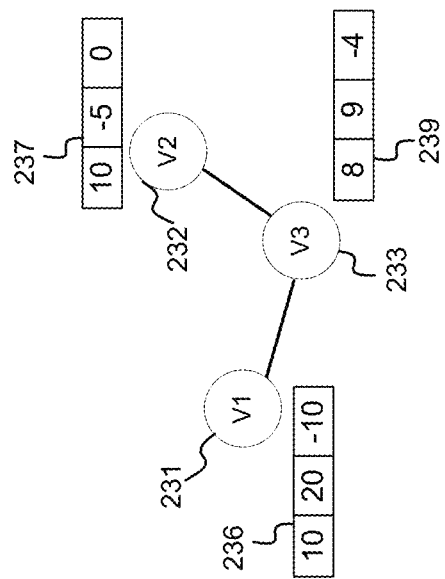
FIGS. 2E and 2F show an example of a message passing network in accordance with aspects of the present disclosure.
Figure 2E:
Figure 2E:
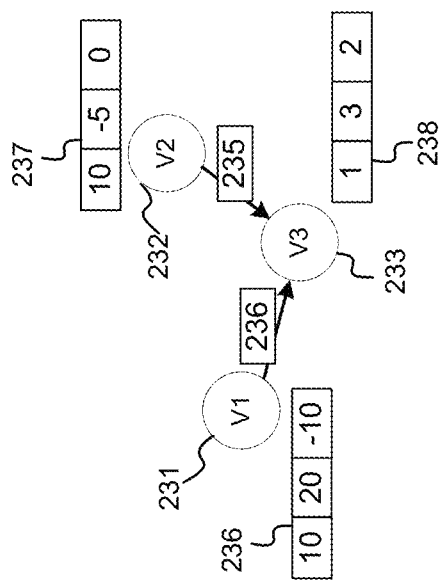

FIGS. 2E and 2F show an example of a message passing network in accordance with aspects of the present disclosure. In particular, nodes 231-233 may include node embeddings 236-238, respectively. In this example, node 233 may be node whose node embeddings 238 are being updated (e.g., the target node). In additions, as shown, node 233's neighborhood includes adjacent nodes 231 and 232. In aspects, updating the node embeddings of node 233 may include passing messages 236 and 235 respectively from adjacent nodes 231 and 232 and receiving them by node 233, and updating the node embeddings of node 233 based on the passed messages 235 and 236. For example, in aspects, a message m may be computed in accordance with equation 1 below:

$$m_v^{t+1} = \sum_{w \in N(v)} h_w^t, \qquad \text{(Equation 1)}$$

where N(v) is the set of adjacent nodes of v, h is the hidden state of a node, and t is the current timestep.

In this case, a neighborhood message (e.g., from node 231 and node 232) to node 233 may include [20, 15, −10], which may be the summation of the node embeddings 236 and 235 of nodes 231 and 232, respectively. From this message, the updated node embeddings for node 233 may be obtained using Equation 2 below:

$$h^{t+1}{}_v = \text{average}(h_v, m^{t+1}{}_v) \qquad \text{(Equation 2)}$$

Using equation 2, the updated node embeddings 239 for node 233 may be computed as [8, 9, −4], as shown in FIG. 2F. The same process may be performed for node 231 and node 232 in order to obtain the node embeddings for nodes 231 and node 232. In this manner, the node embeddings of the nodes of an input graph may be updated using neighborhood information exchanged in a message passing network of the input graph.

Figure 2G:
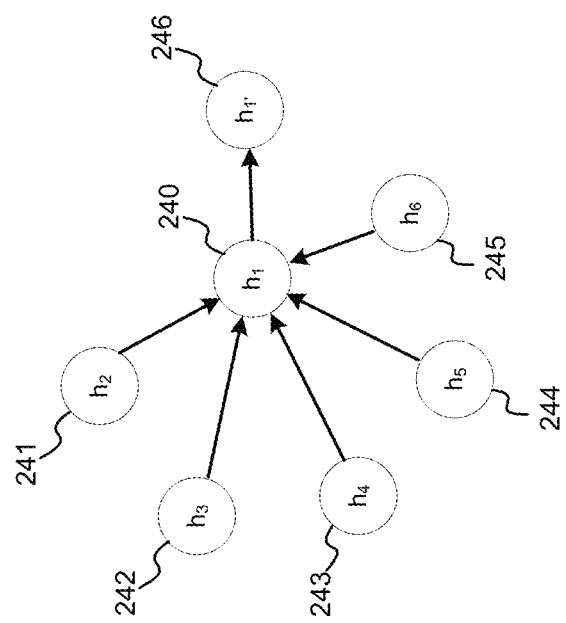
FIG. 2G shows an example of a graph attention network in accordance with aspects of the present disclosure.

In alternative or additional aspects, the GCN of graph encoder 121 updating the set of node features (e.g., the node embeddings) of assembly graph 250 may include implementing a graph attention network to exchange information between the nodes. In aspects, the graph attention network may allow exchange of feature information between nodes, but also additional information including attention information. FIG. 2G shows an example of a graph attention network in accordance with aspects of the present disclosure. In this example, every neighboring node 241-245 of node 240 may send information to target node 240 (e.g., the node whose set of features are being updated). In this case, the information sent to target node 240 from each of the neighboring nodes 241-245 may include a set of features from each neighboring node, as well as an attention coefficient for each attention head k. In aspects, an attention coefficient transmitted from neighboring node i to target node j may be expressed as $\alpha_{ij}^{k}$.

In aspects, the k head features received from nodes 241-245 by node 240 may be aggregated to obtain next-level features $h_1$ for node 240. The aggregation may be performed in accordance with Equation 3 below, where j represents the target node, and i represents the neighboring node transmitting the attention information.

$$\vec{h}_i' = \parallel_{k=1}^{K} \sigma\left(\sum_{j \in N_i} \alpha_{ij}^k W^k \vec{h}_j\right).$$ (Equation 3)

Figure 2H:
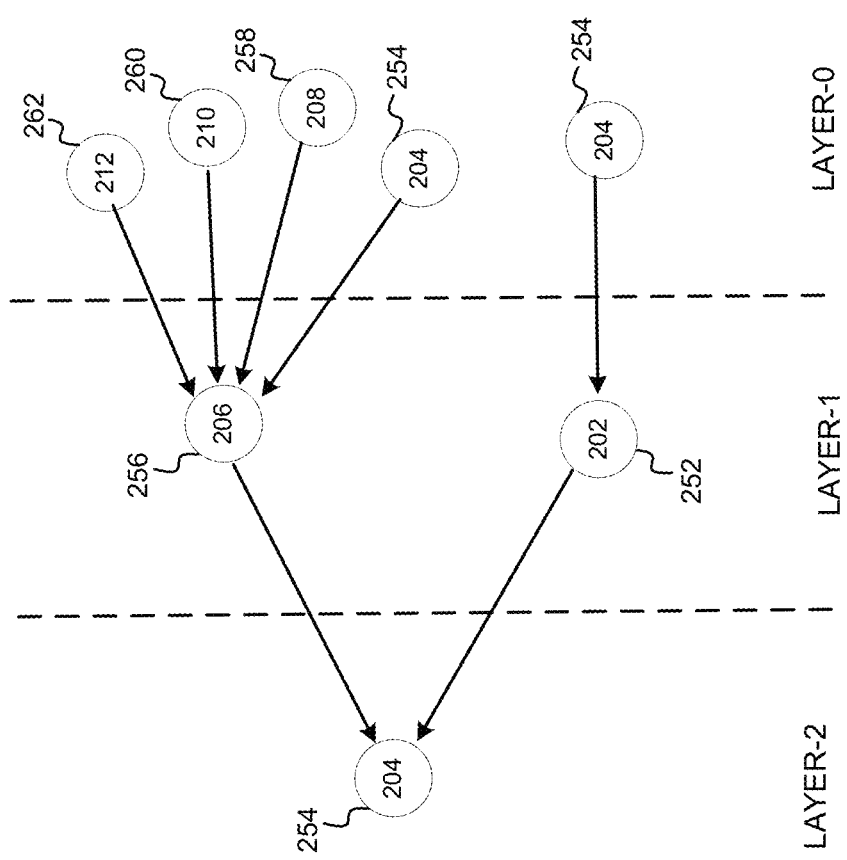
FIG. 2H shows an example illustrating a multi-layered aggregation of messages in accordance with aspects of the present disclosure.

In aspects, the next level features may be passed through various layers, as appropriate in order to obtain the updated set of features for a target node. FIG. 2H is an example illustrating a multi-layered aggregation of messages in accordance with aspects of the present disclosure. As shown, for a target node 254 (e.g., a node for which update node embeddings are being updated), a multi-layered message aggregation may allow aggregation of messages from adjacent nodes, but the messages from the adjacent nodes may already include aggregation of message from nodes adjacent to the adjacent nodes of target node 254. For example, with reference to FIG. 2B, node 204 assembly graph 250 may have adjacent nodes 252 and 256. However, nodes 256 itself has adjacent nodes 258, 260, and 262, in addition to node 254 itself. In this case layer-0 messages from lowest level nodes may be aggregated into node 256, and node 252 at layer-1. For example, messages from nodes adjacent to node 256 (e.g., nodes 262, 260, 268, and 254) may be aggregated into an aggregated message to node 256. Similarly, a message from layer-0 node 254 adjacent to node 252 may be aggregated into an aggregated message to node 252. The aggregated messages received by layer-1 nodes 256 and 252 may be aggregated into an aggregated message to target node 254, a layer-2 node. The aggregated message received by target node 254 may include the information from all other layers and all other nodes. With this information, the node embeddings of target node 254 may be updated using the multi-layered message aggregation.

Figure 3A:
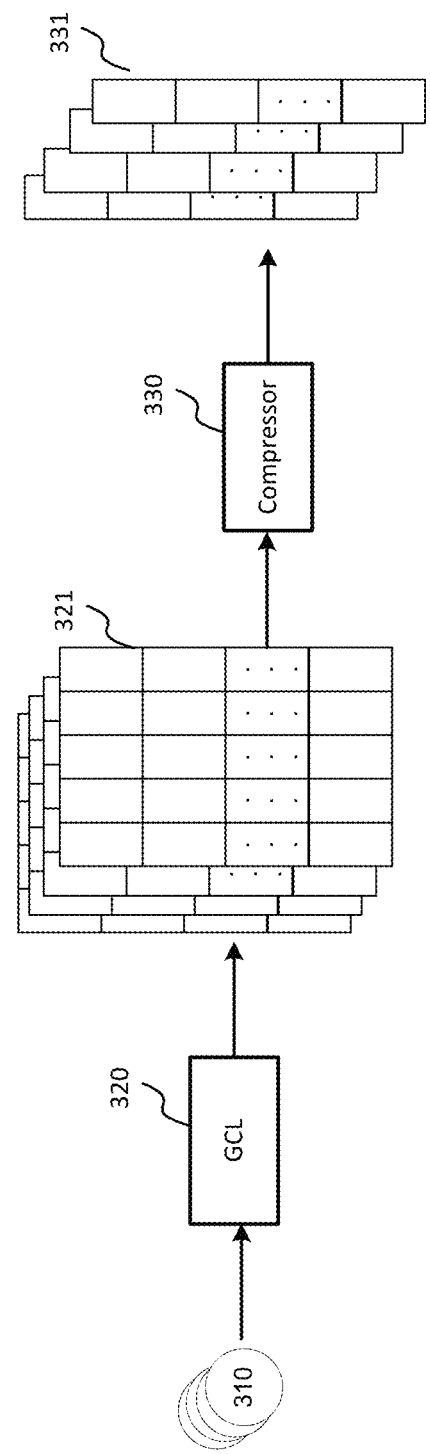
FIG. 3A is a block diagram illustrating the first S-layers of a graph convolutional network (GCN) of a graph encoder implemented in accordance with aspects of the present disclosure.

As noted above, in aspects, the GCN of graph encoder 121 may be implemented in two parts, the first part including S-layers and the second part including T-layers. Additionally, the output of assembly descriptor module 120 may be a disconnected assembly graph that includes component graphs in each node, and a set of features for each node, but component graphs, at this time, may have no relation to the assembly graph. In aspects, in the first S-layers of the GCN of graph encoder 121, assembly graph 250 may be processed to encode the features of the component graphs into graph embeddings. FIG. 3A is a block diagram illustrating the first S-layers of the GCN of graph encoder 121 implemented in accordance with aspects of the present disclosure.

As shown in FIG. 3A, component graphs 310 (e.g., the component graphs of assembly graph 250 as output by assembly descriptor module 120) may be input into graph convolution layer 320 in order to generate node embeddings 321 for the component graphs of assembly graph 250. In aspects, node embeddings 321 for the component graphs of assembly graph 250 may include a set of node embeddings for each component graph, and each set of node embedding for each component graph may include a node embedding for each node (e.g., representing a component face) of the component node. In aspects, in order to use the node embeddings of the component graphs as features of the nodes of assembly graph 250, the GCN of graph encoder 121 may transform the node embeddings of the component graphs into component graph embeddings. In aspects, transforming the node embeddings of the component graphs into component graph embeddings may include compressing each set of node embedding for each component graph into a single embedding for the corresponding component graph using compressor 330. In aspects, compressing a set of node embedding into a single embedding may include pooling the set of node embeddings (e.g., by averaging, max, or min pooling) into a single embedding. The output of compressor 330 may be component graph embeddings 331, including a single embedding for each node (e.g., component graph) of assembly graph 250. In aspects, the single embedding for each node of assembly graph 250 may represent a feature vector representing the component associated with the respective node of assembly graph 250.

In aspects, in the second part of the GCN of graph encoder 121, assembly graph 250 may be passed through the next T-layers of the GCN. At this time, assembly graph 250 may include a single embedding for each node of assembly graph 250, where the single embedding represents a set of discrete features for the component node. In aspects, passing assembly graph 250 through the T-layers of the GCN of graph encoder 121 results in an output including an updated set of node features (e.g., node embeddings). FIG. 3B is a block diagram illustrating the next S-layers of the GCN of graph encoder 121 implemented in accordance with aspects of the present disclosure.

As shown in FIG. 3B, component graph embeddings 331, including a single embedding for each node (e.g., component graph) of assembly graph 250, may be passed through T-layers 340 of the GCN of graph encoder 121 and may output updated node embeddings 341 for the nodes of assembly graph 250. In aspects, updating the node embeddings (e.g., set of node features) for the nodes of assembly graph 250 may be in accordance with the discussion above with respect to updating node embeddings in a graph.

In aspects, as noted above, updating the node embeddings for the nodes of assembly graph 250 may include aggregating messages in a message passing network. In aspects of the present disclosure, aggregating messages in a message passing network may be implemented using a recurrent neural network (RNN). In aspects, at each timestep of the recurrent process of recurrent graph neural network 124, graph encoder 121 may receive as input the hidden state of aggregated messages from the previous timesteps, as well as assembly graph 250 in its current state, and may obtain a new hidden state of aggregated messages. In aspects, graph encoder 121 may also output assembly graph 250 with updated node embeddings. The output of graph encoder 121 may be fed into contact generation module 122 to predict which component should be connected to the current assembly.

With reference back to FIG. 1, and as noted above, functionality of recurrent graph neural network 124 may also include contact generation module 122. In aspects, contact generation module 122 may be configured to receive, at each timestep t, the updated node embeddings of the current state of assembly graph 250, and to predict (and add) at least one link to be added to assembly graph 250 for timestep t. In adding at least one new link to assembly graph 250, contact generation module 122 updates the status of the assembly of product 200 (e.g., updates the status of assembly graph 250). As noted above, the at least one link added to assembly graph 250 at timestep t, may represent a connection of a component of product 200 to the current assembly, and the at least one link may add a component to the assembly of product 200. In this manner, each timestep t in which at least one link is added to assembly graph 250 by contact generation module 122 represents an assembly sequence step and identifies a component that is added to the assembly.

In aspects, contact generation module 122 may operate to identify and predict links by determining whether, for each node-pair in assembly graph 250, a link should be added or not. In aspects, contact generation module 122 may perform the link determination by applying a link prediction/link classification solution to assembly graph 250. In aspects, contact generation module 122 may make a prediction using pairs of node embeddings (e.g., updated node embeddings from two adjacent nodes in assembly graph 250) by applying some prediction head $\hat{y}=\text{Head}_{edge}(h_u, h_v)$, where $h_u$ is the set of features for node u, and $h_v$ is the set of features for node v. In aspects, the prediction head may include a concatenation and application of a deep power network (e.g., a multilayer perceptron (MLP)). In these cases, $h_u$ and $h_v$ may be concatenated together and the concatenation may be applied to the deep power network in order to obtain the prediction. In some aspects, the prediction head may include applying a dot product to $h_u$ and $h_v$ to obtain the link prediction. Based on the link prediction for nodes v and u, contact generation module 122 may determine whether a link should be added between nodes v and u at timestep t. When contact generation module 122 determines that a link should be added between nodes v and u at timestep t, a link is added between nodes v and u. When contact generation module 122 determines that a link should not be added between nodes v and u at timestep t, a link is not added between nodes v and u. This process is continued for all pairs of unconnected nodes of assembly graph 250. Once all new links have been determined, assembly graph 250 is updated to include the new links. The updated assembly graph 250 (e.g., updated with new links) may be fed back to graph encoder 121 to process the next timestep t+1 in accordance with aspects of the present disclosure. When all nodes of assembly graph 250 are linked to at least one other node, the recurrent process of recurrent graph neural network 124 may be stopped, as this may indicate that product 200 is fully assembled.

Figure 4:
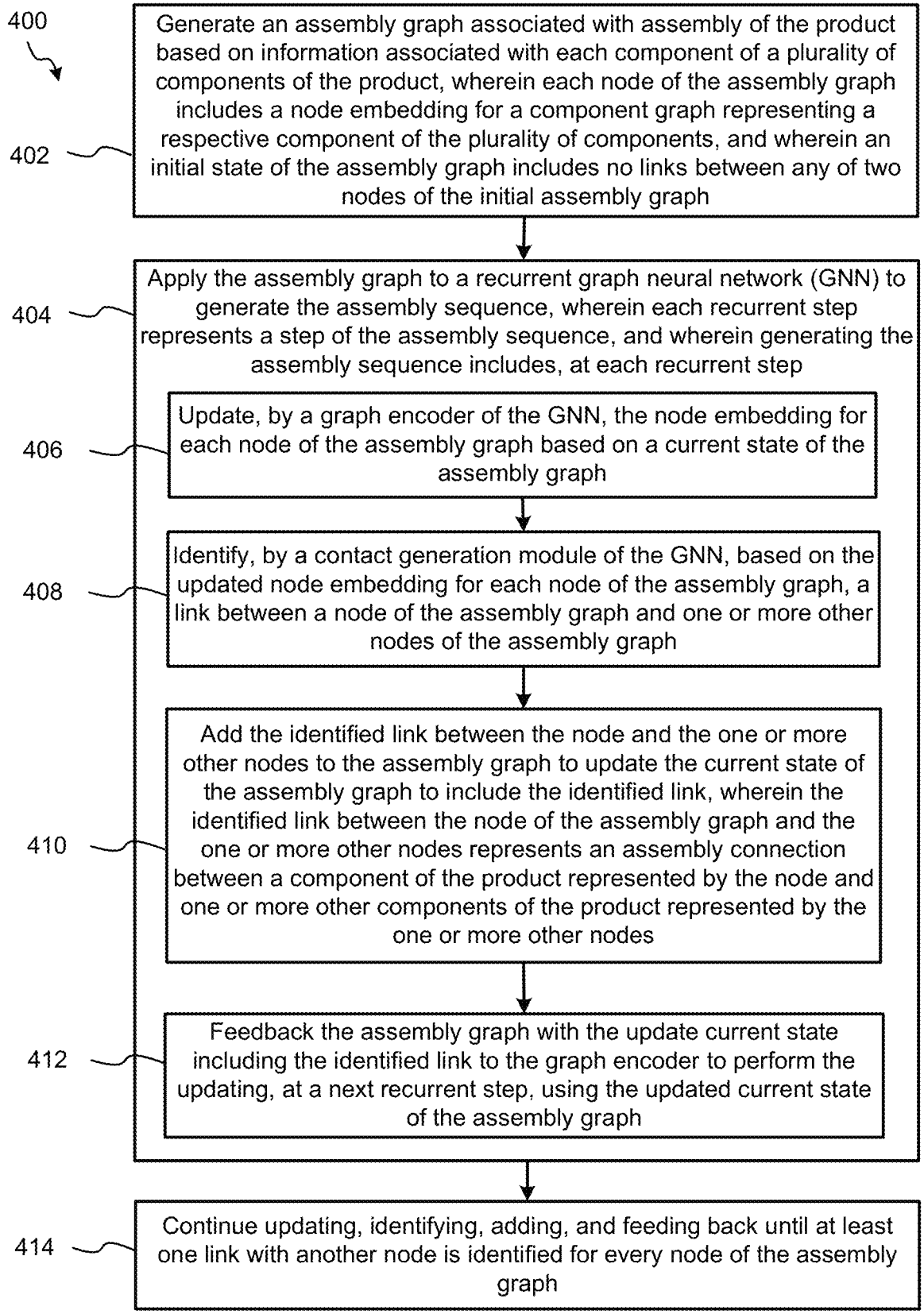
FIG. 4 shows a high level flow diagram of operation of a system configured in accordance with aspects of the present disclosure for providing mechanisms for generating a feasible assembly plan for a product based on data analytics.

FIG. 4 shows a high level flow diagram 400 of operation of a system configured in accordance with aspects of the present disclosure for providing mechanisms for generating a feasible assembly plan for a product based on data analytics. For example, the functions illustrated in the example blocks shown in FIG. 4 may be performed by system 100 of FIG. 1 according to aspects herein.

In general terms, aspects of the present disclosure provide functionality for generating an assembly sequence to assemble a product. As has been noted above, currently, developing a plan or sequence for assembling a product may be a very challenging task. From the example discussed herein of a motor assembly, it may be perceived that even with few components, developing a viable or feasible plan is not a very easy task. The undertaking is even more challenging when the product is more complex, has a difficult geometry, and/or includes hundreds or thousands of components. In this case, the benefits of the techniques disclosed herein are self-evident in that finding a feasible assembly sequence for such a complex product may be impracticable to be performed manually or by brute force. Therefore, Applicant notes that the solution described herein is superior, and thus, provides an advantage over prior art systems.

From a general perspective, the assembly sequence generated in accordance with aspects may consist of a plurality of assembly steps, as noted above. At each assembly step, at least one component of the product may be assembled to one or more other components. In some cases, the at least one component may be connected to the current assembly at a particular assembly step. For example, at a first assembly step of the assembly sequence, a first component of the product may be connected to a second component, in accordance with the assembly sequence generated by system 100. At this time, the current assembly may consist of the first component connected to the second component. At a second assembly step of the assembly sequence, a third component may be connected to the current assembly, and the current assembly may now consist of the first, second, and third components. In this case, the third component may be connected to the first component, the second component, or both components. The assembly sequence may continue to be followed until all components of the products are connected to at least one other component. As noted above, which components are connected at each step may be determined by which links in the assembly graph are identified at each timestep t of the recurrent process of aspects.

For ease of illustration, flow diagram 400 will be discussed with additional reference to FIGS. 5A-5F, 6A-6F, and 7A-7F. FIGS. 5A-5F illustrate various views of product 200 as it is being assembled in accordance with the identified assembly sequence in accordance with aspects of the present disclosure. FIGS. 6A-6F illustrate various states of assembly graph 250 as links are sequentially added in accordance with the identified assembly sequence in accordance with aspects of the present disclosure. FIGS. 7A-7F are block diagrams illustrating the recurrent operation of the recurrent graph neural network during operations in accordance with aspects of the present disclosure.

The method 400 includes generating an assembly graph associated with assembly of the product based on information associated with each component of a plurality of components of the product, at 402. For example, based on 3D CAD information associated with the various components (e.g., cover 202, endplate 204, fillet 206, shaft 208, bearing 210, and front plate 212) of product 200, assembly graph 250 may be generated. In aspects, an initial state of the assembly graph includes no links between any of two nodes of the initial assembly graph. For example, all nodes of assembly graph 250 may initially be disconnected from all other nodes.

In aspects, assembly graph 250 may be generated by including at each node of assembly graph 250, a component graph for each component of product 200. For example, a component graph for each of component of product 200 may be obtained, where the nodes of each component graph represent the faces of the respective component, and the edges represent the connections between the faces. At each node of assembly graph 250, an assembly graph for the corresponding component of product 200 (e.g., the component represented by the respective node of assembly graph 250) may be added. In this manner, each node of assembly graph 250 represents a component of product 200, and each component is represented by a component graph in assembly graph 250.

Figure 6A:
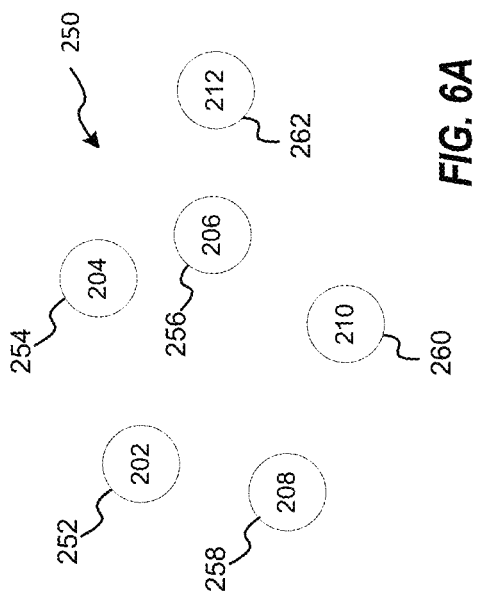
FIGS. 6A-6F illustrate various states of an assembly graph as links are sequentially added in accordance with the identified assembly sequence in accordance with aspects of the present disclosure.
Figure 7A:
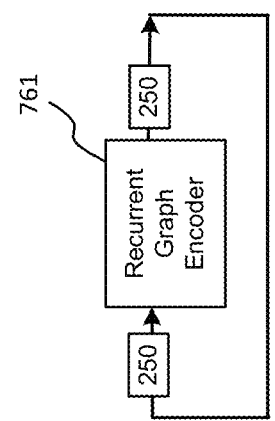
FIGS. 7A-7F are block diagrams illustrating a recurrent operation of a recurrent graph neural network during operations in accordance with aspects of the present disclosure.
Figure 5A:
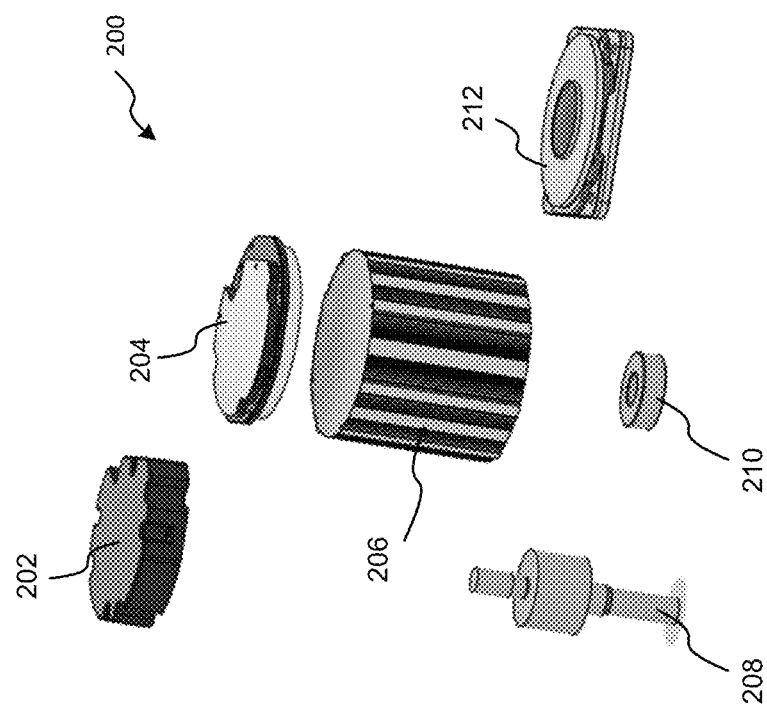
FIGS. 5A-5F illustrate various views of a product as it is being assembled in accordance with an identified assembly sequence in accordance with aspects of the present disclosure.

In aspects, e.g., as shown in FIGS. 5A, 6A, and 7A, assembly graph 250, in its initial disconnected state, and with the component graphs in the nodes of assembly graph 250, may be input into recurrent graph encoder 761 of FIGS. 7A-7F. Recurrent graph encoder 761 may include the functionality of recurrent graph neural network 124, or may be recurrent graph neural network 124, described above. Recurrent graph encoder 761 may encode assembly graph 250 to generate updated node embeddings (e.g., as single node embedding for each node (e.g., a single embedding for each component graph) of assembly graph 250) as described above. At this point, each node of assembly graph 250 may include a node embedding for a component graph representing a respective component of the plurality of components of product 250.

The method 400 includes applying the assembly graph to a recurrent graph neural network to generate the assembly sequence, at 404. In aspects, each recurrent step represents a step of the assembly sequence. In aspects, generating the assembly sequence includes, at each recurrent step, updating, by a graph encoder of the recurrent graph neural network, the node embedding for each node of the assembly graph based on a current state of the assembly graph, at 406, identifying, by a contact generation module of the recurrent graph neural network, based on the updated node embedding for each node of the assembly graph, a link between a node of the assembly graph and one or more other nodes of the assembly graph, at 408, adding the identified link between the node and the one or more other nodes to the assembly graph to update the current state of the assembly graph to include the identified link, at 410, and feeding back the assembly graph with the updated current state including the identified link to the graph encoder to perform the updating, at a next recurrent step, using the updated current state of the assembly graph, at 412. In aspects, the identified link between the node of the assembly graph and the one or more other nodes represents an assembly connection between a component of the product represented by the node and one or more other components of the product represented by the one or more other nodes.

The method 400 includes continuing the updating, identifying, adding, and feeding back until at least one link with another node is identified for every node of the assembly graph at 414.

Figure 6B:
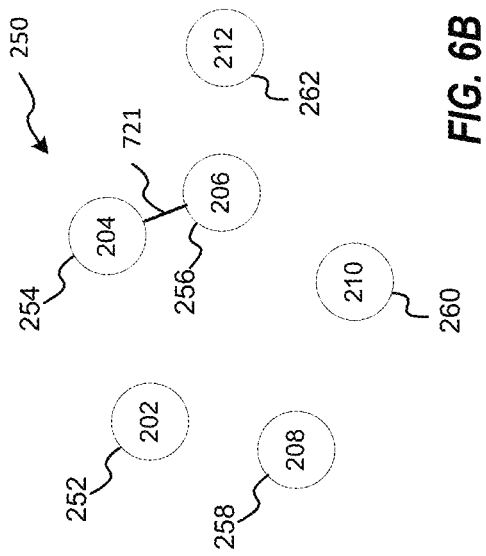
Figure 7B:
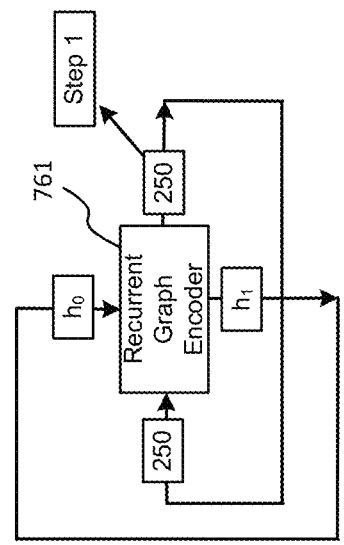
Figure 5B:
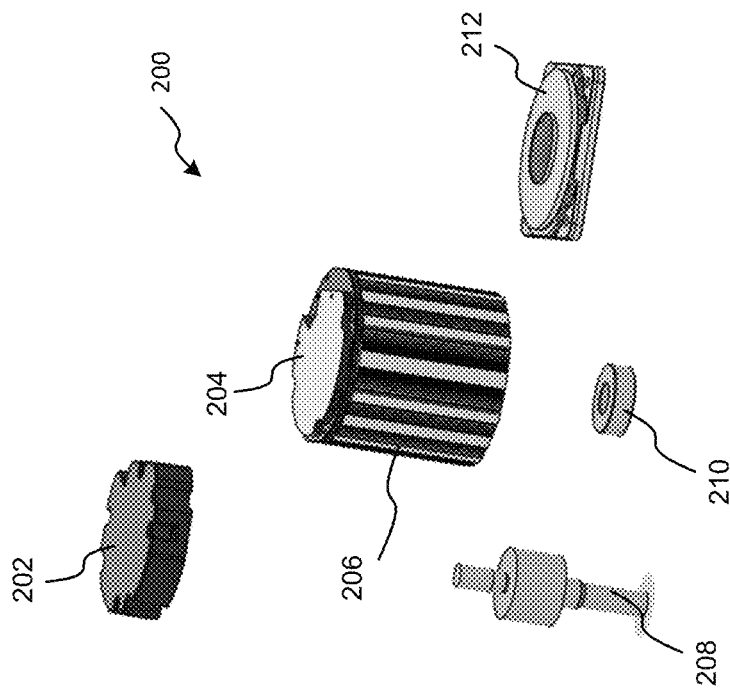

For example, at step 1 illustrated in FIGS. 5B, 6B, and 7B, assembly graph 250 may be input into recurrent graph encoder 761. Recurrent graph encoder 761 may also take as input $h_0$, which may represent neighborhood aggregation memory (e.g., aggregated messages) associated with the previous states of assembly graph 250. Recurrent graph encoder 761 may process the input and may operate to update the node embeddings of assembly graph 250 and, based on the updated embeddings, may identify new link 721, linking nodes 254 and 256 to be added to assembly graph 250 at this recurrent step 1. In aspects, as nodes 254 and 256 represent endplate 204 and fillet 206, new link 721 may be determined, and/or added to the assembly sequence, as an assembly step 1 indicating a connection of endplate 204 and fillet 206 together. In this case, execution of this assembly step 1 would result in an assembly that includes endplate 204 and fillet 206. At this step 1, cover 202, shaft 208, bearing 210, and front plate 212 remain unconnected. At this step, recurrent graph encoder 761 may output two things: 1) a new aggregated neighborhood memory $h_1$, and 2) assembly graph 250 with a new state that include new link 721. The output of recurrent graph encoder 761 may be fed back into recurrent graph encoder 761 to be used at the next recurrent step 2.

Figure 6C:
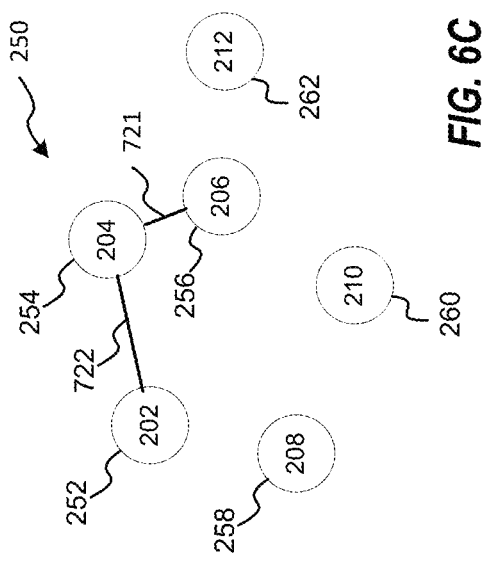
Figure 7C:
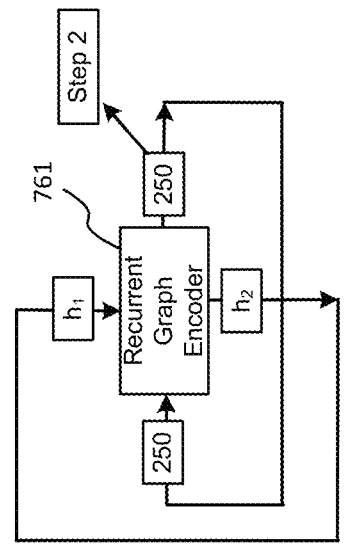
Figure 5C:
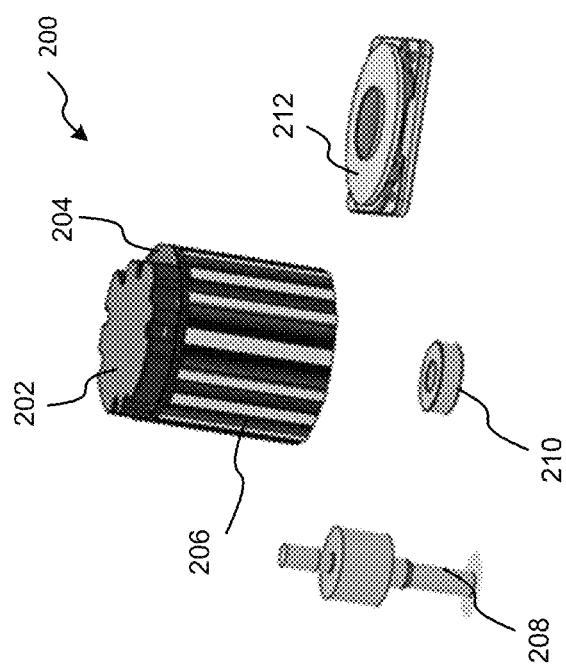

At step 2 illustrated in FIGS. 5C, 6C, and 7C, assembly graph 250, including new link 721, and aggregated neighborhood memory $h_1$ may be input into recurrent graph encoder 761. Recurrent graph encoder 761 may process the input and may operate to update the node embeddings of assembly graph 250, based on the updated state of assembly graph 250 including new link 721 and, based on the updated embeddings, may identify new link 722, linking nodes 254 and 252 to be added to assembly graph 250 at this recurrent step 2. In aspects, as nodes 254 and 252 represent endplate 204 and cover 202, new link 722 may be determined, and/or added to the assembly sequence, as assembly step 2 indicating a connection of cover 202 and endplate 204 together. In this case, execution of this assembly step 2 would result in a current assembly that includes endplate 204, fillet 206, and cover 202. At this step 2, shaft 208, bearing 210, and front plate 212 remain unconnected. At this step 2, recurrent graph encoder 761 may output a new aggregated neighborhood memory $h_2$, and assembly graph 250 with a new state that include new link 722 (in addition to previous new link 721). The output of recurrent graph encoder 761 may be fed back into recurrent graph encoder 761 to be used at the next recurrent step 3.

Figure 6D:
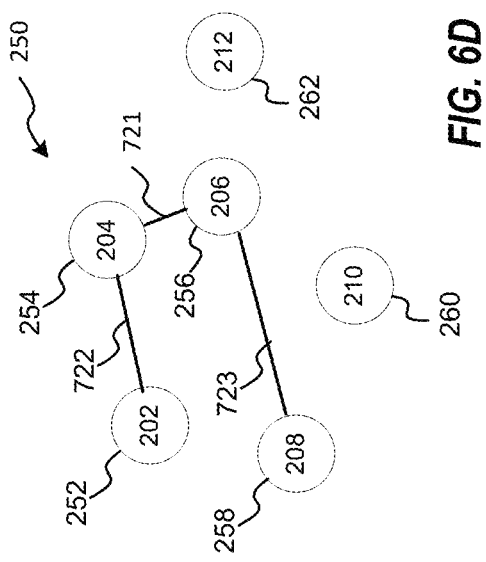
Figure 7D:
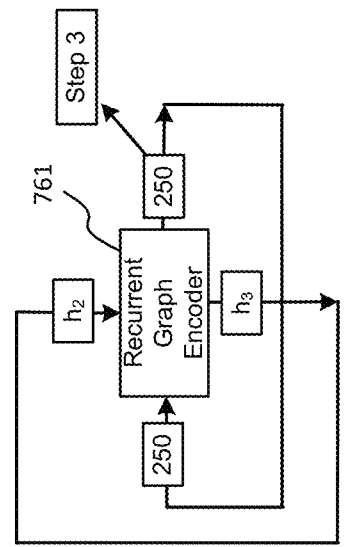
Figure 5D:
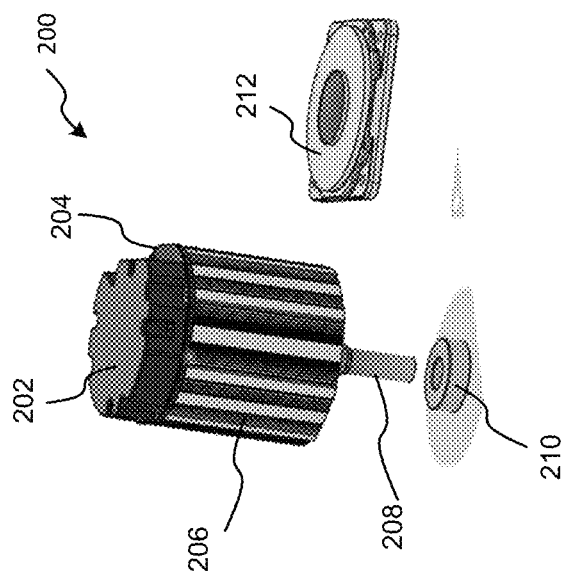

At step 3 illustrated in FIGS. 5D, 6D, and 7D, assembly graph 250, including added links 721 and 722, and aggregated neighborhood memory $h_2$ may be input into recurrent graph encoder 761. Recurrent graph encoder 761 may process the input and may operate to update the node embeddings of assembly graph 250, based on the updated state of assembly graph 250 including links 721 and 722 and, based on the updated embeddings, may identify new link 723, linking nodes 256 and 258 to be added to assembly graph 250 at this recurrent step 3. In aspects, as nodes 256 and 258 represent fillet 206 and shaft 208, new link 723 may be determined, and/or added to the assembly sequence, as assembly step 3 indicating a connection of shaft to the fillet 206. In this case, execution of this assembly step 3 would result in a current assembly that includes endplate 204, fillet 206, cover 202, and shaft 208. At this step 3, bearing 210 and front plate 212 remain unconnected. At this step 3, recurrent graph encoder 761 may output a new aggregated neighborhood memory $h_3$, and assembly graph 250 with a new state that include new link 723 (in addition to previous new links 721 and 722). The output of recurrent graph encoder 761 may be fed back into recurrent graph encoder 761 to be used at the next recurrent step 4.

Figure 6E:
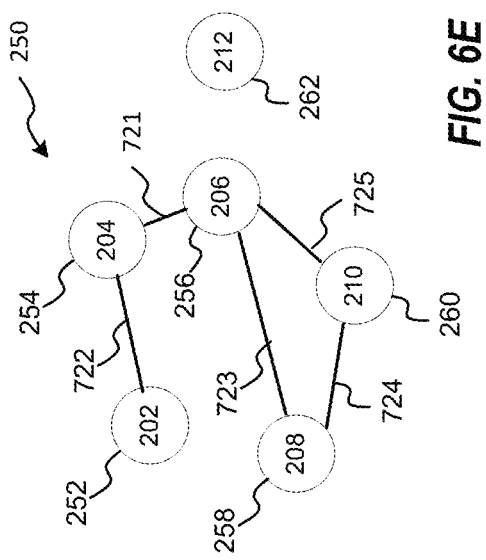
Figure 7E:
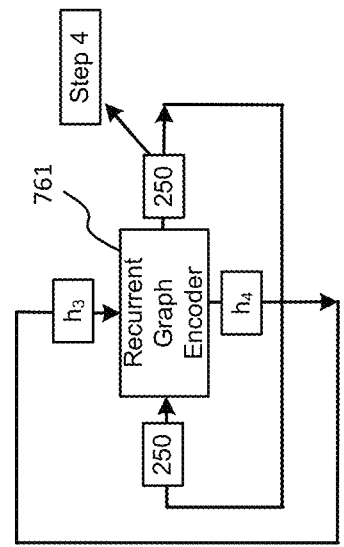
Figure 5E:
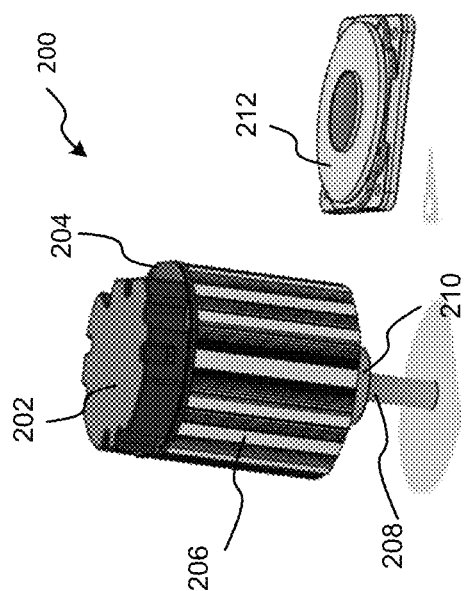

At step 4 illustrated in FIGS. 5E, 6E, and 7E, assembly graph 250, including added links 721-723, and aggregated neighborhood memory $h_3$ may be input into recurrent graph encoder 761. Recurrent graph encoder 761 may process the input and may operate to update the node embeddings of assembly graph 250, based on the updated state of assembly graph 250 including links 721-723 and, based on the updated embeddings, may identify new links 724 and 725, linking node 260 top both nodes 258 and 256, respectively, to be added to assembly graph 250 at this recurrent step 4. In this case, node 260 represents bearing 210, and nodes 256 and 258 represent fillet 206 and shaft 208. In aspects, new links 724 and 725 may be determined, and/or added to the assembly sequence, as assembly step 4 indicating a contact connection of bearing 210 to both fillet 206 and shaft 208. In this case, execution of this assembly step 4 would result in a current assembly that includes endplate 204, fillet 206, cover 202, shaft 208, and bearing 210. At this step 4, only front plate 212 remains unconnected. At this step 4, recurrent graph encoder 761 may output a new aggregated neighborhood memory $h_4$, and assembly graph 250 with a new state that include new links 724 and 725 (in addition to previous new links 721-723). The output of recurrent graph encoder 761 may be fed back into recurrent graph encoder 761 to be used at the next recurrent step 5.

Figure 7F:
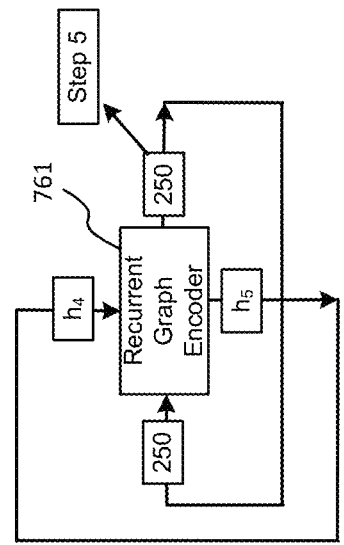
Figure 6F:
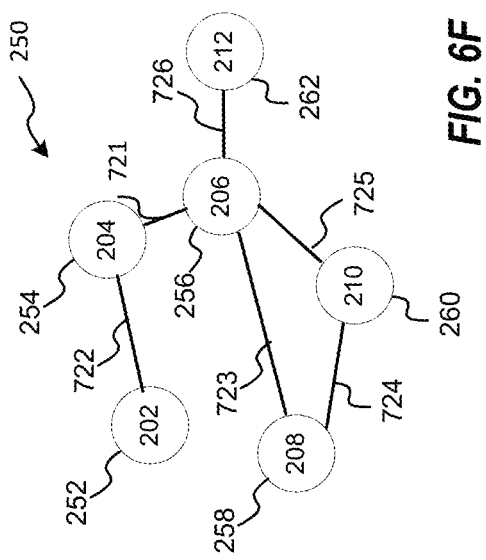
Figure 5F:
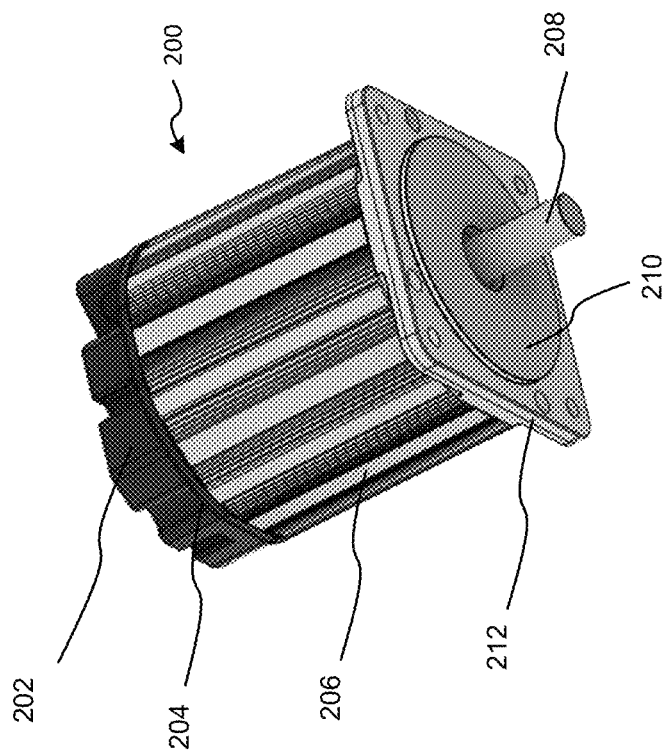

At step 5 illustrated in FIGS. 5F, 6F, and 7F, assembly graph 250, including added links 721-725, and aggregated neighborhood memory $h_4$ may be input into recurrent graph encoder 761. Recurrent graph encoder 761 may process the input and may operate to update the node embeddings of assembly graph 250, based on the updated state of assembly graph 250 including links 721-725 and, based on the updated embeddings, may identify new link 726, linking nodes 262 and 256, to be added to assembly graph 250 at this recurrent step 5. In aspects, as nodes 262 and 256 represent front plate 262 and fillet 206, new link 726 may be determined, and/or added to the assembly sequence, as assembly step 5 indicating a connection of front plate 262 to fillet 206. In this case, execution of this assembly step 5 would result in a current assembly that includes endplate 204, fillet 206, cover 202, shaft 208, bearing 210, and front plate 212. At this step 5, no component of product 200 remains unconnected. Furthermore, at this point, no node of assembly graph 250 remains disconnected from at least one other node. Put another way, all nodes of assembly graph 250 are connected to at least one other node, indicating that all components of product 200 are connected to at least one other component. This indicates that, after execution of assembly step 5 of the assembly sequence, product 200 is fully assembled. In this manner, steps 1-5 would represent a feasible assembly sequence identified by system 100 of aspects. At this point, as no components of product 200 remain disassembled, the recurrent process may be stopped.

In aspects, the identified assembly sequence (e.g., steps 1-5) may be output to a user, or may be stored for later retrieval. The identified assembly sequence may be formatted in a format that may be understood by a user, based on predetermined requirements or configuration.

It is noted that other types of devices and functionality may be provided according to aspects of the present disclosure and discussion of specific devices and functionality herein have been provided for purposes of illustration, rather than by way of limitation. It is noted that the operations of the method 400 of FIG. 4 may be performed in any order, or that operations of one method may be performed during performance of another method. It is also noted that the method 400 of FIG. 4 may also include other functionality or operations consistent with the description of the operations of the system 100 of FIG. 1.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Components, the functional blocks, and the modules described herein with respect to FIGS. 1-7F) include processors, electronics devices, hardware devices, electronics components, logical circuits, memories, software codes, firmware codes, among other examples, or any combination thereof. In addition, features discussed herein may be implemented via specialized processor circuitry, via executable instructions, or combinations thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Skilled artisans will also readily recognize that the order or combination of components, methods, or interactions that are described herein are merely examples and that the components, methods, or interactions of the various aspects of the present disclosure may be combined or performed in ways other than those illustrated and described herein.

The various illustrative logics, logical blocks, modules, circuits, and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules, and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or any conventional processor, controller, microcontroller, or state machine. In some implementations, a processor may also be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or any combination thereof. Implementations of the subject matter described in this specification also may be implemented as one or more computer programs, that is one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that may be enabled to transfer a computer program from one place to another. A storage media may be any available media that may be accessed by a computer. By way of example, and not limitation, such computer-readable media can include random-access memory (RAM), read-only memory (ROM), electrically erasable programmable read-only memory (EEPROM), CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, hard disk, solid state disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to some other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of any device as implemented.

Certain features that are described in this specification in the context of separate implementations also may be implemented in combination in a single implementation. Conversely, various features that are described in the context of a single implementation also may be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted may be incorporated in the example processes that are schematically illustrated. For example, one or more additional operations may be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, some other implementations are within the scope of the following claims. In some cases, the actions recited in the claims may be performed in a different order and still achieve desirable results.

As used herein, including in the claims, various terminology is for the purpose of describing particular implementations only and is not intended to be limiting of implementations. For example, as used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). The term "coupled" is defined as connected, although not necessarily directly, and not necessarily mechanically; two items that are "coupled" may be unitary with each other. the term "or," when used in a list of two or more items, means that any one of the listed items may be employed by itself, or any combination of two or more of the listed items may be employed. For example, if a composition is described as containing components A, B, or C, the composition may contain A alone; B alone; C alone; A and B in combination; A and C in combination; B and C in combination; or A, B, and C in combination. Also, as used herein, including in the claims, "or" as used in a list of items prefaced by "at least one of" indicates a disjunctive list such that, for example, a list of "at least one of A, B, or C" means A or B or C or AB or AC or BC or ABC (that is A and B and C) or any of these in any combination thereof. The term "substantially" is defined as largely but not necessarily wholly what is specified—and includes what is specified; e.g., substantially 90 degrees includes 90 degrees and substantially parallel includes parallel—as understood by a person of ordinary skill in the art. In any disclosed aspect, the term "substantially" may be substituted with "within [a percentage] of" what is specified, where the percentage includes 0.1, 1, 5, and 10 percent; and the term "approximately" may be substituted with "within 10 percent of" what is specified. The phrase "and/or" means and or.

Although the aspects of the present disclosure and their advantages have been described in detail, it should be understood that various changes, substitutions and alterations can be made herein without departing from the spirit of the disclosure as defined by the appended claims. Moreover, the scope of the present application is not intended to be limited to the particular implementations of the process, machine, manufacture, composition of matter, means, methods and processes described in the specification. As one of ordinary skill in the art will readily appreciate from the present disclosure, processes, machines, manufacture, compositions of matter, means, methods, or operations, presently existing or later to be developed that perform substantially the same function or achieve substantially the same result as the corresponding aspects described herein may be utilized according to the present disclosure. Accordingly, the appended claims are intended to include within their scope such processes, machines, manufacture, compositions of matter, means, methods, or operations.

What is claimed is:

1. A method for generating an assembly sequence for a product, the method comprising:
generating, by one or more processors, an assembly graph associated with assembly of the product based on information associated with each component of a plurality of components of the product, wherein each node of the assembly graph includes a node embedding for a component graph representing a respective component of the plurality of components, and wherein an initial state of the assembly graph includes no links between any of two nodes of the initial assembly graph;
generating, by the one or more processors, the assembly sequence by applying the assembly graph to a recurrent graph neural network, wherein each recurrent step represents a step of the assembly sequence, and wherein generating the assembly sequence includes, at each recurrent step:
updating, by a graph encoder of the recurrent graph neural network, the node embedding for each node of the assembly graph based on a current state of the assembly graph;
identifying, by the recurrent graph neural network, based on the updated node embedding for each node of the assembly graph, a link between a node of the assembly graph and one or more other nodes of the assembly graph;
adding the identified link between the node and the one or more other nodes to the assembly graph to update the current state of the assembly graph to include the identified link, wherein the identified link between the node of the assembly graph and the one or more other nodes represents an assembly connection between a component of the product represented by the node and one or more other components of the product represented by the one or more other nodes; and
feeding back the assembly graph with the updated current state including the identified link to the graph encoder for updating, at a next recurrent step, the node embedding of each node of the assembly graph using the updated current state of the assembly graph; and
assembling the product with the generated assembly sequence by continuing, by the one or more processors, the updating, identifying, adding, and feeding back until at least one link with another node is identified for every node of the assembly graph.

2. The method of claim 1, wherein the information associated with each component of the plurality of components of the product includes three-dimension (3D) computer aided design (CAD) modeling information.

3. The method of claim 1, wherein generating the assembly graph includes:
including, at each node of the assembly graph, a component graph representing a respective component of the product, wherein each component graph includes a plurality of nodes representing the faces of the respective component and a plurality of edges representing the connections between the faces;
obtaining a set of features for each component graph of the assembly graph; and
encoding, using a graph convolutional network (GCN) of the graph encoder, the assembly graph to generate a single node embedding for each component graph of the assembly graph.

4. The method of claim 1, wherein updating, by the graph encoder of the recurrent graph neural network, the node embedding for each node of the assembly graph based on a current state of the assembly graph includes:
based on a hidden state of aggregated messages for the assembly graph from a previous recurrent step and the assembly graph:
generating a new hidden state of aggregated messages for the assembly graph for the current recurrent step; and
updating the node embedding for each node of the assembly graph.

5. The method of claim 4, wherein the hidden state of aggregated messages is obtained based on a message passing network of a graph convolution layer.

6. The method of claim 4, wherein the hidden state of aggregated messages is obtained based on a graph attention network, the graph attention network including a multilayer message aggregation.

7. The method of claim 1, further comprising:
generating the assembly sequence to include a plurality of steps, each step of the plurality of steps corresponding to each recurrent step in which a link is added to the state of the assembly graph and including an indication of the identified link at a respective recurrent step, wherein each step of the plurality of steps indicates an assembly connection between one component of the product and at least one other component of the product.

8. A system for generating an assembly sequence for a product, the system comprising:
a memory; and
one or more processors communicatively coupled to the memory, the one or more processors are configured to:
generate an assembly graph associated with assembly of the product based on information associated with each component of a plurality of components of the product, wherein each node of the assembly graph includes a node embedding for a component graph representing a respective component of the plurality of components, and wherein an initial state of the assembly graph includes no links between any of two nodes of the initial assembly graph;
generate the assembly sequence by applying the assembly graph to a recurrent graph neural network, wherein each recurrent step represents a step of the assembly sequence, and wherein configuration of the one or more processors to generate the assembly sequence includes configuration of the one or more processors to, at each recurrent step:
update, by a graph encoder of the recurrent graph neural network, the node embedding for each node of the assembly graph based on a current state of the assembly graph;
identify, the recurrent graph neural network, based on the updated node embedding for each node of the assembly graph, a link between a node of the assembly graph and one or more other nodes of the assembly graph;
add the identified link between the node and the one or more other nodes to the assembly graph to update the current state of the assembly graph to include the identified link, wherein the identified link between the node of the assembly graph and the one or more other nodes represents an assembly connection between a component of the product represented by the node and one or more other components of the product represented by the one or more other nodes; and feedback the assembly graph with the updated current state including the identified link to the graph encoder for updating, at a next recurrent step, of the node embedding of each node of the assembly graph using the updated current state of the assembly graph; and continue updating, identifying, and adding until at least one link with another node is identified for every node of the assembly graph, thereby the generated assembly sequence is used to assemble the product.

9. The system of claim 8, wherein the information associated with each component of the plurality of components of the product includes three-dimension (3D) computer aided design (CAD) modeling information.

10. The system of claim 8, wherein the configuration of the one or more processors to generate the assembly graph includes configuration of the one or more processors to:

include, at each node of the assembly graph, a component graph representing a respective component of the product, wherein each component graph includes a plurality of nodes representing the faces of the respective component and a plurality of edges representing the connections between the faces;

obtain a set of features for each component graph of the assembly graph; and encode, using a graph convolutional network (GCN) of the graph encoder, the assembly graph to generate a single node embedding for each component graph of the assembly graph.

11. The system of claim 8, wherein the configuration of the one or more processors to update, by the graph encoder of the recurrent graph neural network, the node embedding for each node of the assembly graph based on a current state of the assembly graph includes configuration of the one or more processors to:

based on a hidden state of aggregated messages for the assembly graph from a previous recurrent step and the assembly graph:

generate a new hidden state of aggregated messages for the assembly graph for the current recurrent step; and update the node embedding for each node of the assembly graph.

12. The system of claim 11, wherein the hidden state of aggregated messages is obtained based on a message passing network of a graph convolution layer.

13. The system of claim 11, wherein the hidden state of aggregated messages is obtained based on a graph attention network, the graph attention network including a multilayer message aggregation.

14. The system of claim 8, wherein the one or more processors are further configured to:

generate the assembly sequence to include a plurality of steps, each step of the plurality of steps corresponding to each recurrent step in which a link is added to the state of the assembly graph and including an indication of the identified link at a respective recurrent step, wherein each step of the plurality of steps indicates an assembly connection between one component of the product and at least one other component of the product.

15. A non-transitory computer-readable storage medium storing instructions that, when executed by one or more processors, cause the one or more processors to perform operations for generating an assembly sequence for a product, the operations comprising:

generating an assembly graph associated with assembly of the product based on information associated with each component of a plurality of components of the product, wherein each node of the assembly graph includes a node embedding for a component graph representing a respective component of the plurality of components, and wherein an initial state of the assembly graph includes no links between any of two nodes of the initial assembly graph;

generating the assembly sequence by applying the assembly graph to a recurrent graph neural network, wherein each recurrent step represents a step of the assembly sequence, and wherein generating the assembly sequence includes, at each recurrent step:

updating, by a graph encoder of the recurrent graph neural network, the node embedding for each node of the assembly graph based on a current state of the assembly graph;

identifying, by the recurrent graph neural network, based on the updated node embedding for each node of the assembly graph, a link between a node of the assembly graph and one or more other nodes of the assembly graph;

adding the identified link between the node and the one or more other nodes to the assembly graph to update the current state of the assembly graph to include the identified link, wherein the identified link between the node of the assembly graph and the one or more other nodes represents an assembly connection between a component of the product represented by the node and one or more other components of the product represented by the one or more other nodes; and feeding back the assembly graph with the updated current state including the identified link to the graph encoder for updating, at a next recurrent step, the node embedding of each node of the assembly graph using the updated current state of the assembly graph; and continuing the updating, identifying, and adding until at least one link with another node is identified for every node of the assembly graph, thereby the generated assembly sequence is used to assemble the product.

16. The non-transitory computer-readable storage medium of claim 15, wherein the information associated with each component of the plurality of components of the product includes three-dimension (3D) computer aided design (CAD) modeling information.

17. The non-transitory computer-readable storage medium of claim 15, wherein generating the assembly graph includes:

including, at each node of the assembly graph, a component graph representing a respective component of the product, wherein each component graph includes a plurality of nodes representing the faces of the respective component and a plurality of edges representing the connections between the faces;

obtaining a set of features for each component graph of the assembly graph; and encoding, using a graph convolutional network (GCN) of the graph encoder, the assembly graph to generate a single node embedding for each component graph of the assembly graph.

18. The non-transitory computer-readable storage medium of claim 15, wherein updating, by the graph encoder of the recurrent graph neural network, the node embedding for each node of the assembly graph based on a current state of the assembly graph includes:
based on a hidden state of aggregated messages for the assembly graph from a previous recurrent step and the assembly graph:
generating a new hidden state of aggregated messages for the assembly graph for the current recurrent step; and
updating the node embedding for each node of the assembly graph.

19. The non-transitory computer-readable storage medium of claim 18, wherein the hidden state of aggregated messages is obtained based on one or more of:

a message passing network of a graph convolution layer; or a graph attention network, the graph attention network including a multilayer message aggregation.

20. The non-transitory computer-readable storage medium of claim 15, wherein the operations further comprise:
generating the assembly sequence to include a plurality of steps, each step of the plurality of steps corresponding to each recurrent step in which a link is added to the state of the assembly graph and including an indication of the identified link at a respective recurrent step, wherein each step of the plurality of steps indicates an assembly connection between one component of the product and at least one other component of the product.

* * * * *